(12) United States Patent
Wang et al.

(10) Patent No.: US 8,039,203 B2
(45) Date of Patent: Oct. 18, 2011

(54) INTEGRATED CIRCUITS AND METHODS OF DESIGN AND MANUFACTURE THEREOF

(75) Inventors: Helen Wang, LaGrangeville, NY (US); Scott D. Halle, Hopewell Junction, NY (US); Henning Haffner, Pawling, NY (US); Haoren Zhuang, Hopewell Junction, NY (US); Klaus Herold, Poughquag, NY (US); Matthew E. Colburn, Schenectady, NY (US); Allen H. Gabor, Katonah, NY (US); Zachary Baum, Gardiner, NY (US); Scott M. Mansfield, Hopewell Junction, NY (US); Jason E. Meiring, New Fairfield, CT (US)

(73) Assignees: Infineon Technologies AG, Neubiberg (DE); International Business Machines Corporation, Armonk, NY (US)

( * ) Notice: Subject to any disclaimer, the term of this patent is extended or adjusted under 35 U.S.C. 154(b) by 569 days.

(21) Appl. No.: 12/126,741

(22) Filed: May 23, 2008

(65) Prior Publication Data
US 2009/0081563 A1 Mar. 26, 2009

Related U.S. Application Data

(63) Continuation-in-part of application No. 11/860,955, filed on Sep. 25, 2007, now Pat. No. 7,785,946.

(51) Int. Cl.
*H01L 21/027* (2006.01)

(52) U.S. Cl. ............ 430/312; 430/5; 430/323; 430/394; 430/311; 438/712; 438/708; 438/697; 438/942; 257/E21.023

(58) Field of Classification Search .................. 257/368, 257/E21.023; 430/5, 312, 311, 323, 394; 438/712, 708, 697, 942, 689
See application file for complete search history.

(56) References Cited

U.S. PATENT DOCUMENTS

| | | | |
|---|---|---|---|
| 5,308,741 A | 5/1994 | Kemp | |
| 5,563,012 A | 10/1996 | Neisser | |
| 5,821,014 A | 10/1998 | Chen et al. | |
| 6,421,820 B1 | 7/2002 | Mansfield et al. | |
| 6,734,762 B2 | 5/2004 | Cornett et al. | |
| 6,777,147 B1 | 8/2004 | Fonseca et al. | |
| 6,787,469 B2 | 9/2004 | Houston et al. | |
| 6,929,887 B1 | 8/2005 | Lin et al. | |
| 7,495,294 B2 * | 2/2009 | Higashitani | 257/390 |
| 2001/0020878 A1 | 9/2001 | Speidell et al. | |
| 2004/0063038 A1 * | 4/2004 | Shin et al. | 430/311 |
| 2006/0264001 A1 * | 11/2006 | Tran et al. | 438/401 |
| 2008/0014684 A1 | 1/2008 | Blatchford et al. | |

OTHER PUBLICATIONS

Meiring, J. E., et al., "ACLV Driven Double-Patterning Decomposition with Extensively Added Printing Assist Features (PrAFs)," Proceedings of SPIE, Conference Proceedings Paper, vol. 6520, Mar. 26, 2007, 12 pages.

Miller, S., et al., "Lithography Value Drivers in IC Design & Manufacturing," Semiconductor Fabtech—30$^{TH}$ Edition, Aug. 25, 2006, pp. 76-83.

Rabkin, P., et al., "Fabless/Foundry DFM: 45nm and Beyond," Semiconductor Fabtech—32$^{ND}$ Edition, Dec. 20, 2006, pp. 76-82.

Haffner, H., et al., "Mastering Double Exposure Process Window Aware OPC by Means of Virtual Targets," Proceedings of SPIE, Conference Proceedings Paper, vol. 6349, Oct. 20, 2006, 11 pages.

* cited by examiner

Primary Examiner — Ngan Ngo
Assistant Examiner — Benjamin Tzu-Hung Liu
(74) Attorney, Agent, or Firm — Slater & Matsil, L.L.P.

(57) ABSTRACT

Integrated circuits and methods of manufacture and design thereof are disclosed. For example, a method of manufacturing includes depositing a gate material over a semiconductor substrate, and depositing a first resist layer over the gate material. A first mask is used to pattern the first resist layer to form first and second resist features. The first resist features include pattern for gate lines of the semiconductor device and the second resist features include printing assist features. A second mask is used to form a resist template; the second mask removes the second resist features.

26 Claims, 28 Drawing Sheets

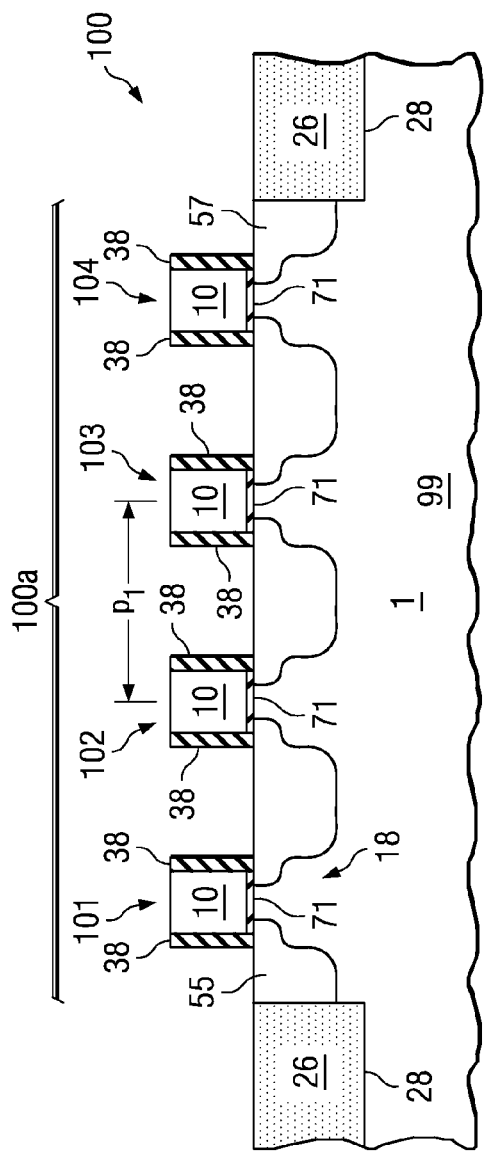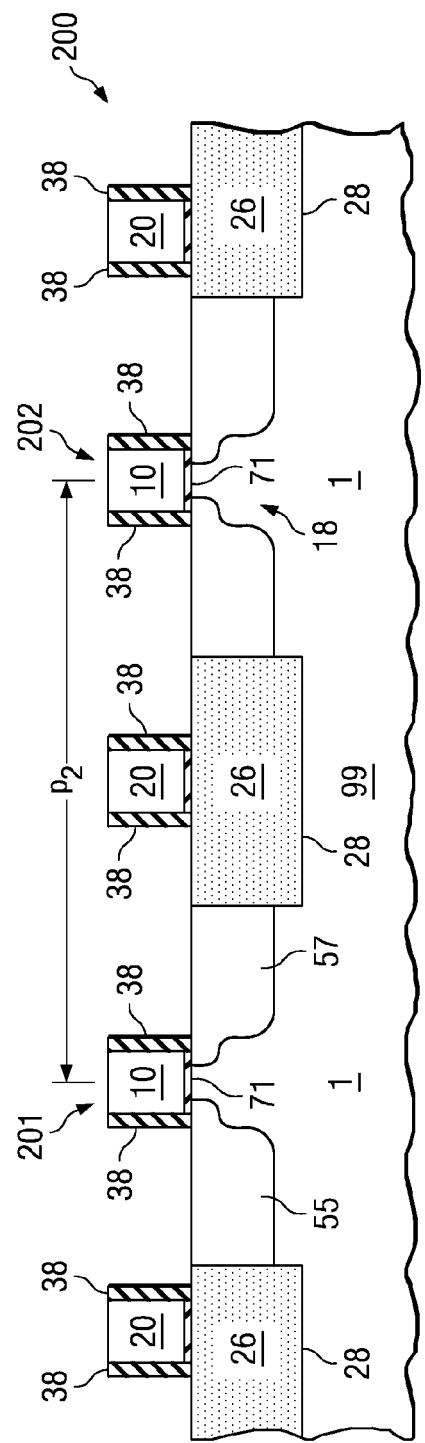

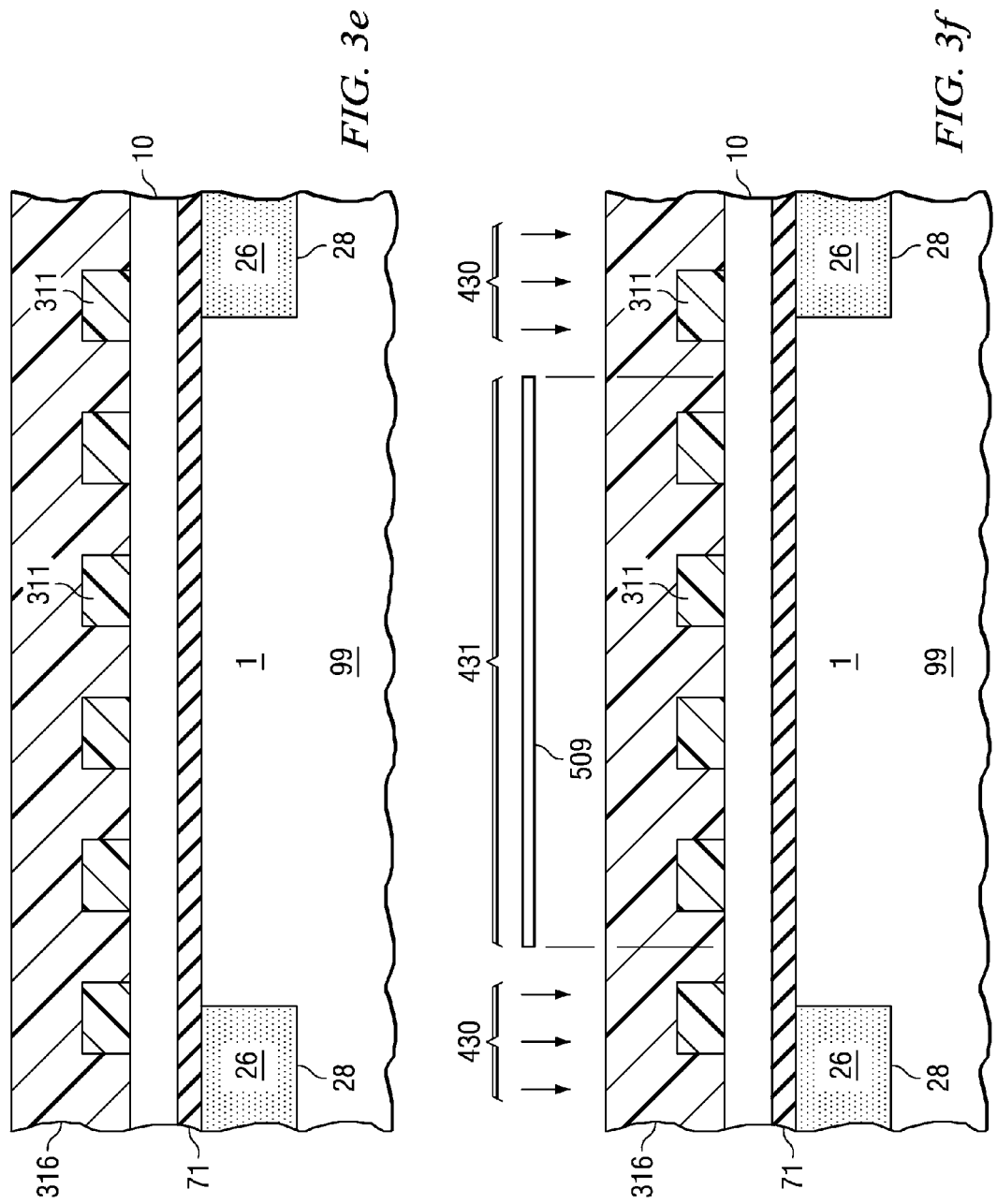

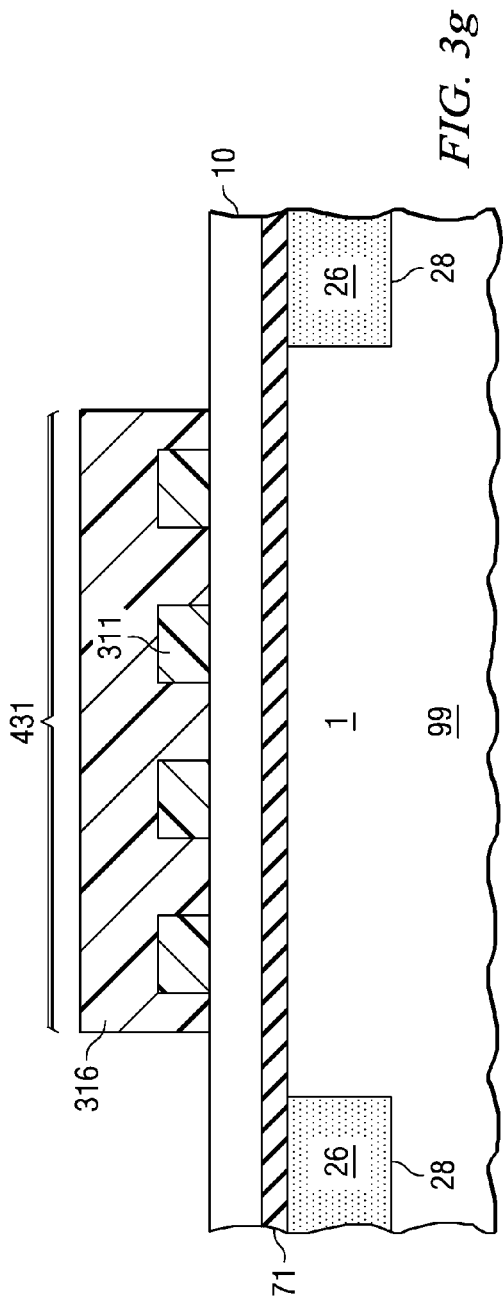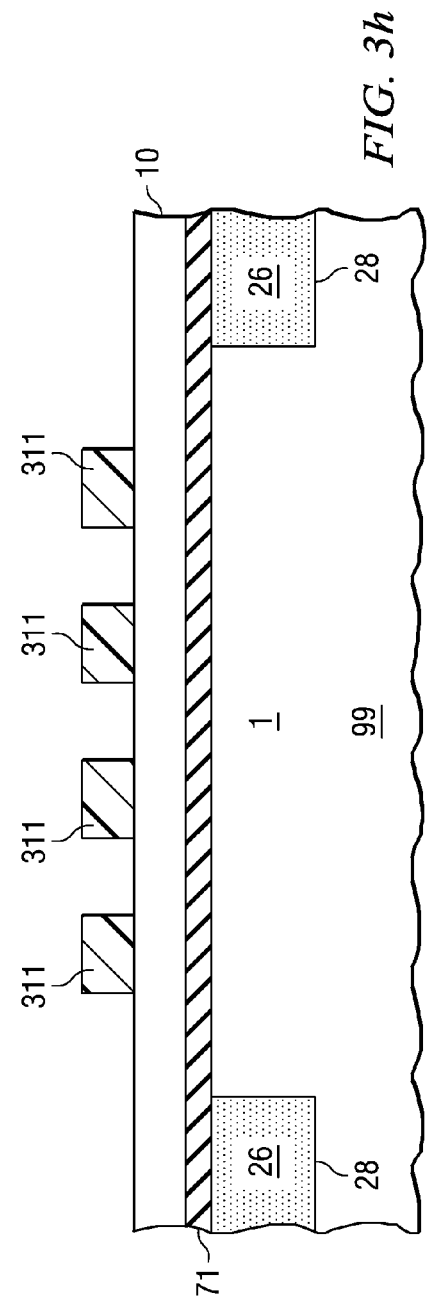

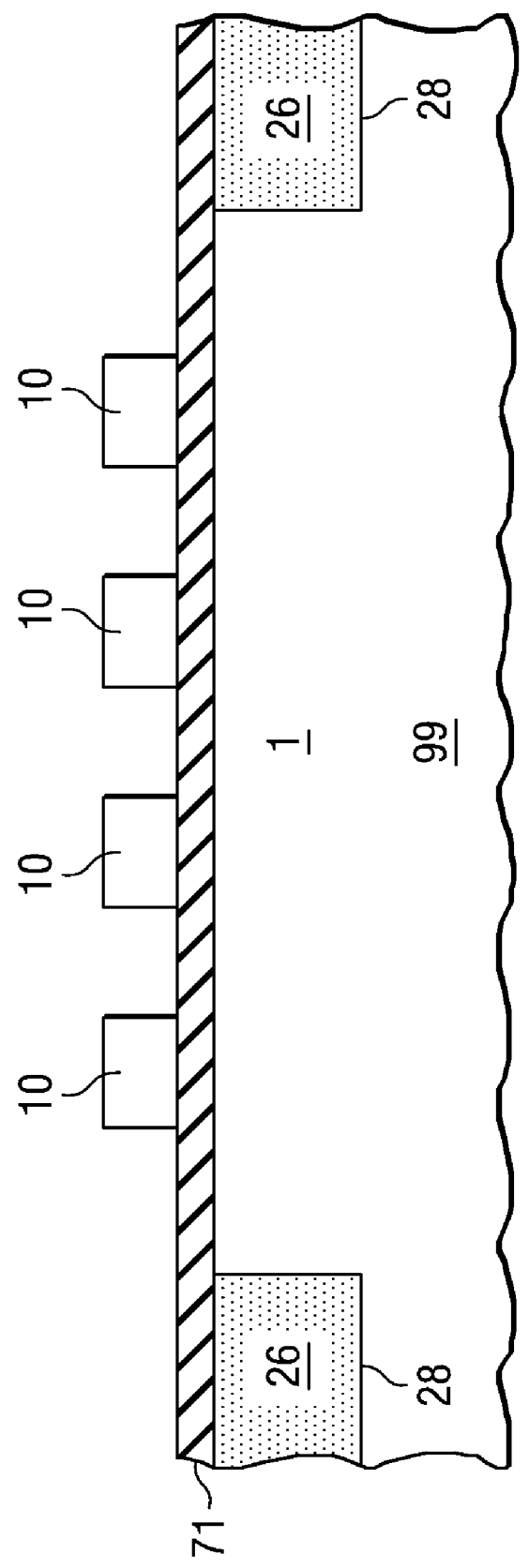

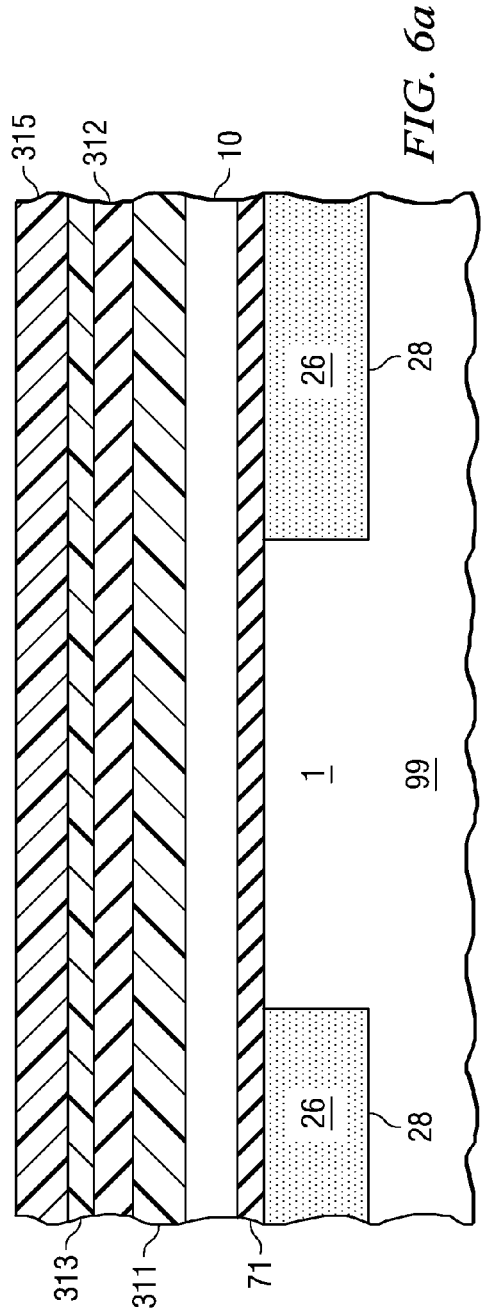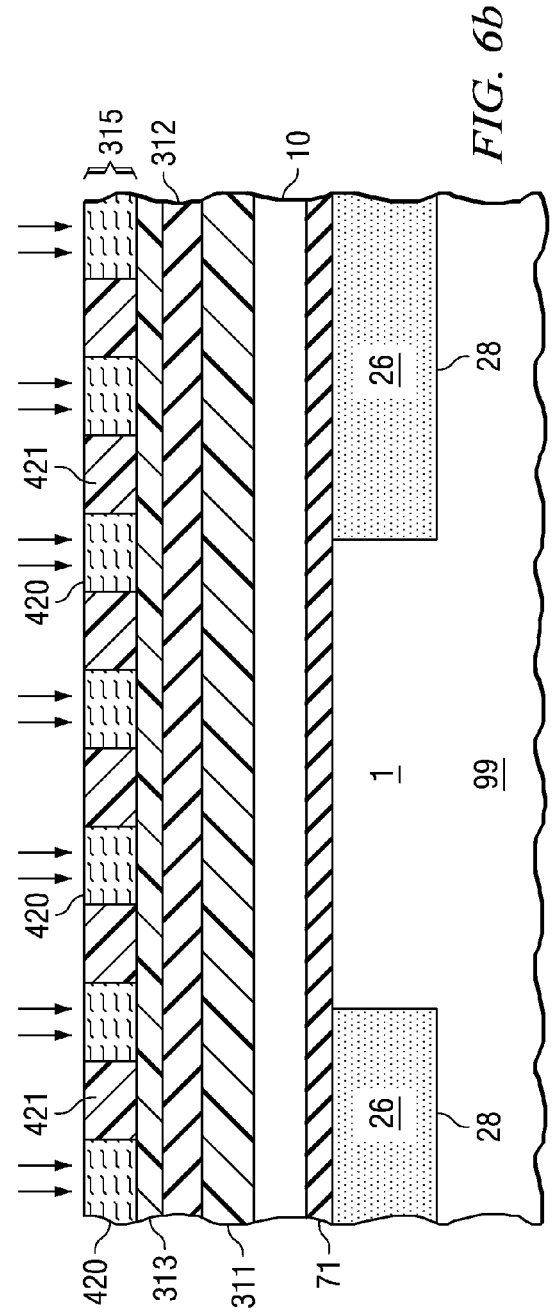

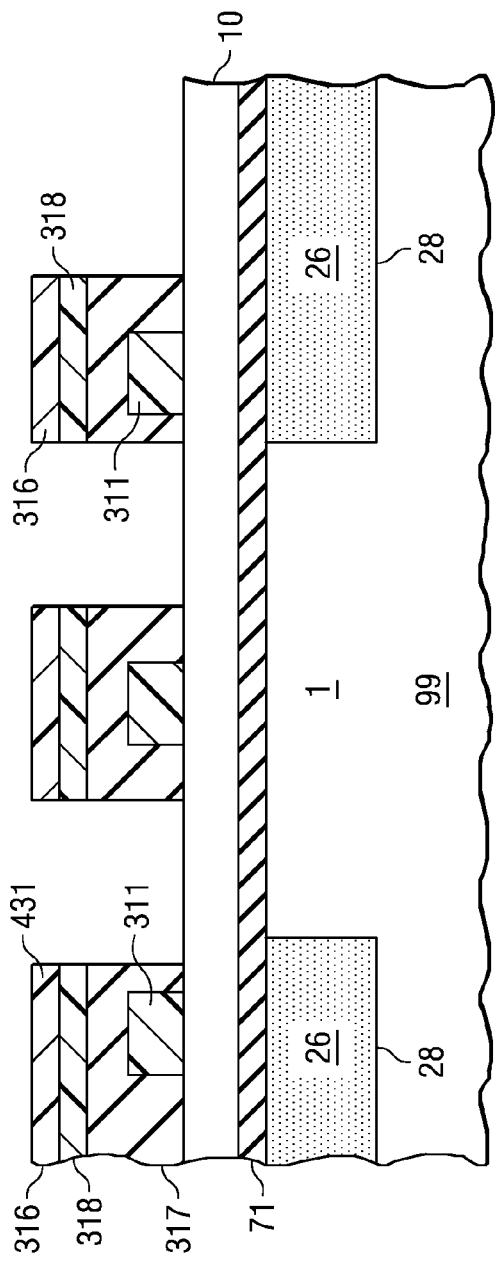
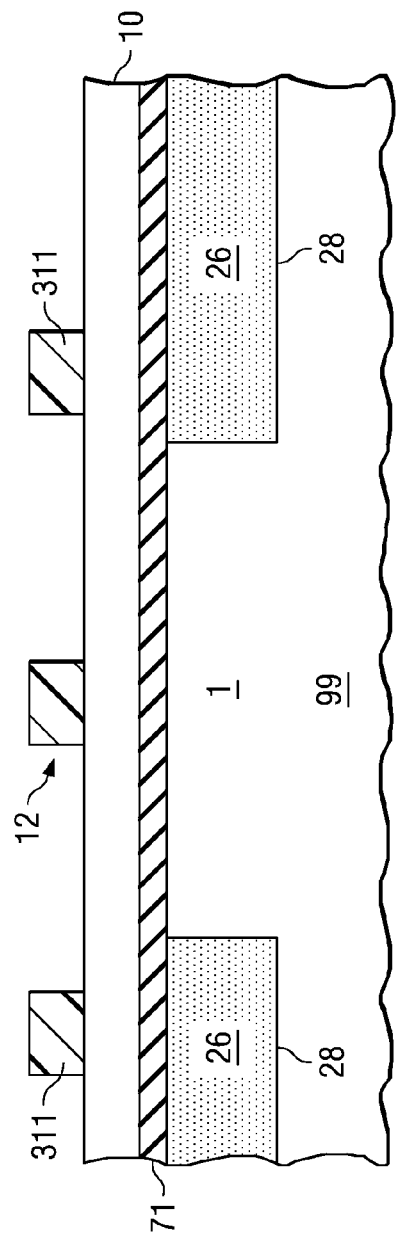

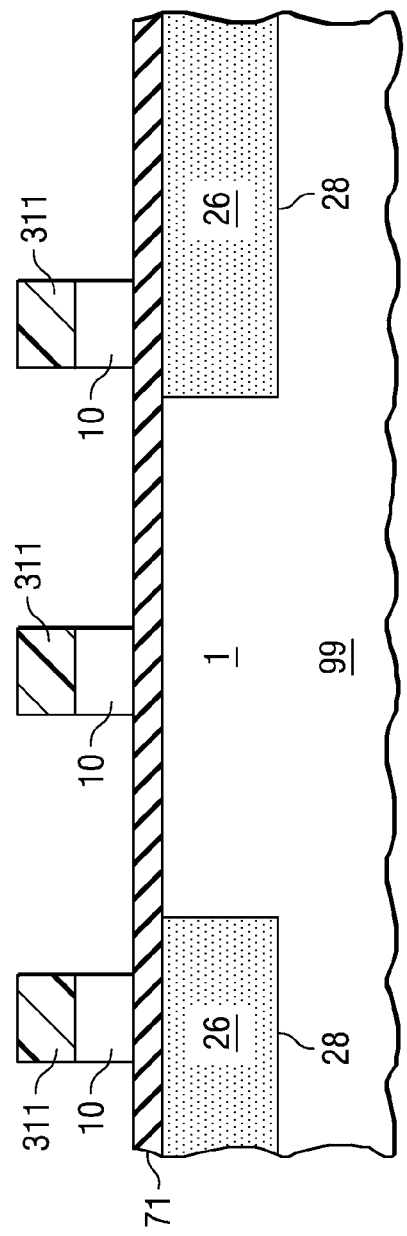
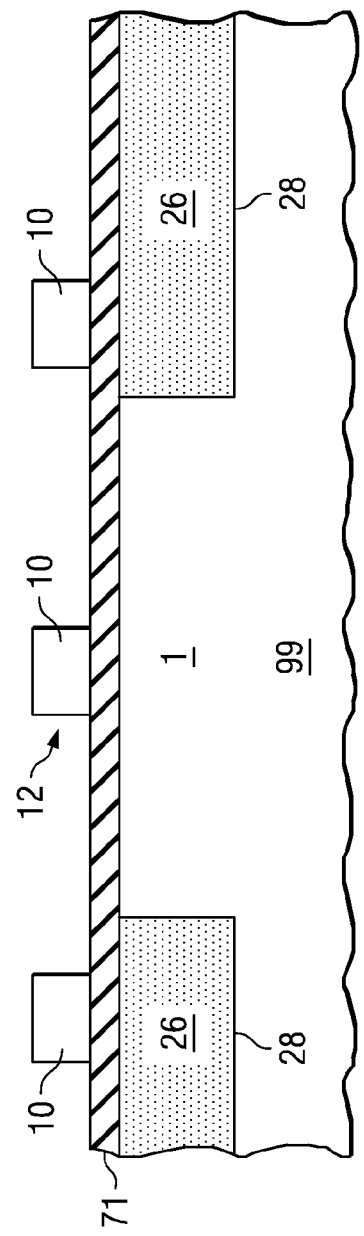
FIG. 6i
FIG. 6j

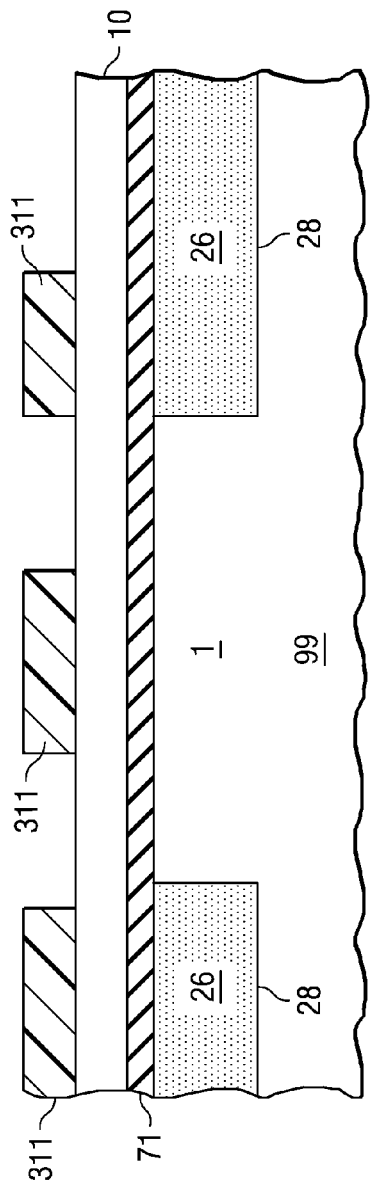
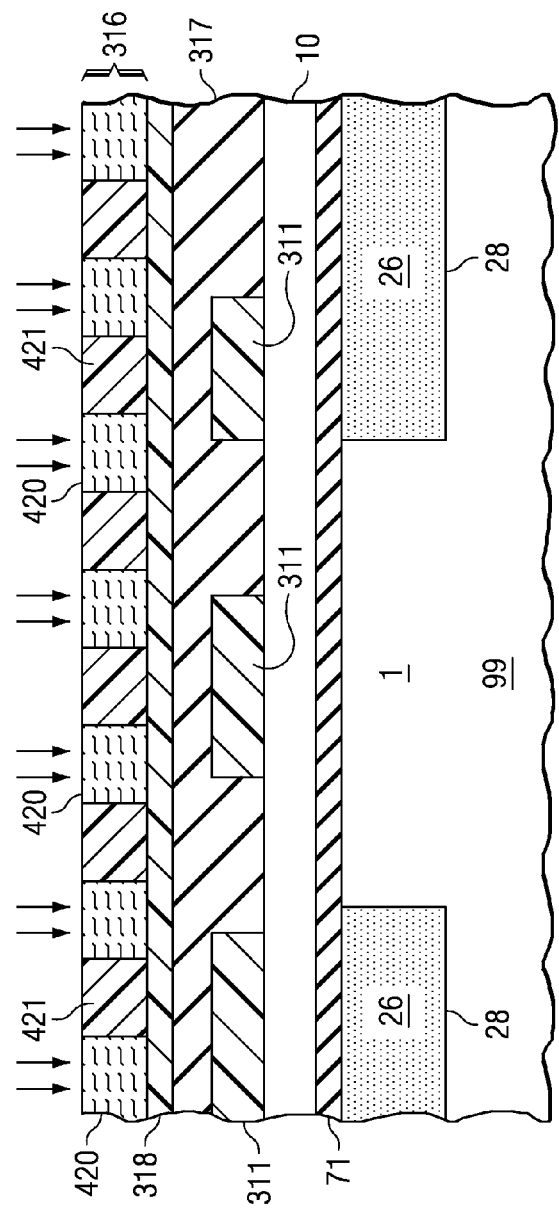

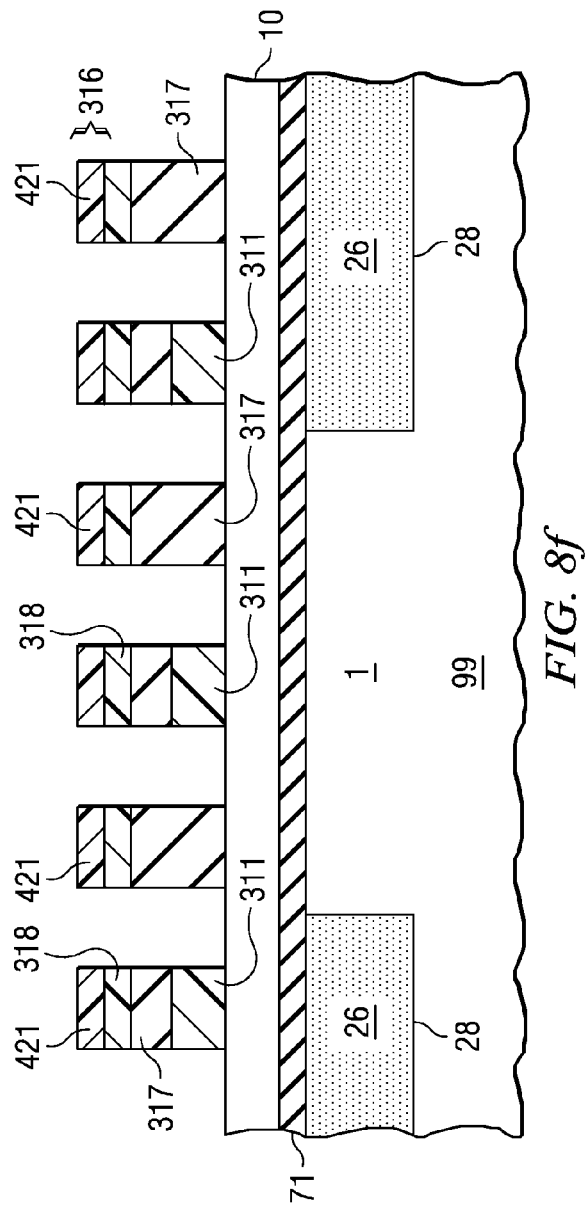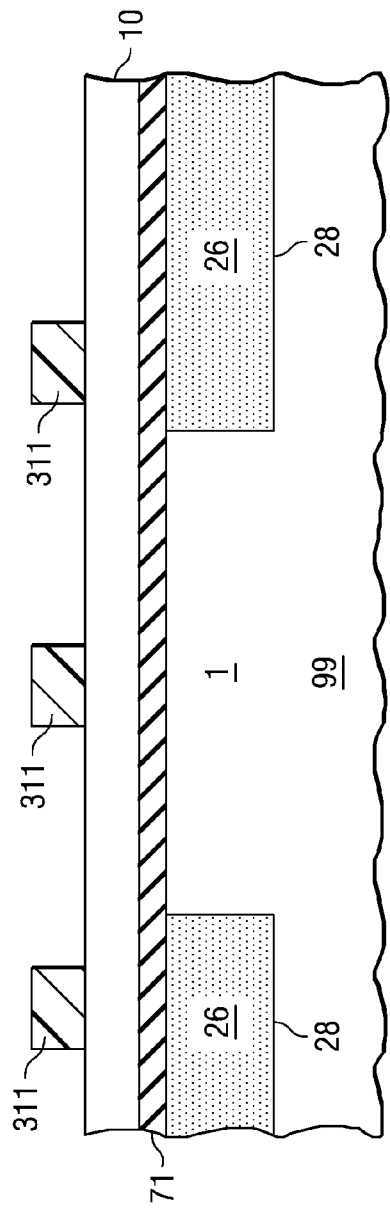

INTEGRATED CIRCUITS AND METHODS OF DESIGN AND MANUFACTURE THEREOF

This application is a continuation-in-part application of commonly assigned patent application Ser. No. 11/860,955, filed Sep. 25, 2007 now U.S. Pat. No. 7,785,946, entitled "Integrated Circuits and Methods of Design and Manufacture Thereof," which application is hereby incorporated herein by reference in its entirety.

TECHNICAL FIELD

The present invention relates generally to the fabrication of integrated circuits, and more particularly to fabrication of semiconductor devices using lithography techniques.

BACKGROUND

Generally, semiconductor devices are used in a variety of electronic applications, such as computers, cellular phones, personal computing devices, and many other applications. Home, industrial, and automotive devices that, in the past, comprised only mechanical components now have electronic parts that require semiconductor devices, for example.

Semiconductor devices are manufactured by depositing many different types of material layers over a semiconductor workpiece or wafer, and patterning the various material layers using lithography. The material layers typically comprise thin films of conductive, semi-conductive and insulating materials that are patterned and etched to form integrated circuits (ICs). There may be a plurality of transistors, memory devices, switches, conductive lines, diodes, capacitors, logic circuits, and other electronic components formed on a single die or chip, for example.

There is a trend in the semiconductor industry towards reducing the size of features, e.g., the circuits, elements, conductive lines, and vias of semiconductor devices, in order to increase performance of the semiconductor devices, for example. The minimum feature size of semiconductor devices has steadily decreased over time. However, as features of semiconductor devices become smaller, it becomes more difficult to pattern the various material layers because of diffraction and other effects that occur during a lithography process. For example, key metrics such as resolution and depth of focus of the imaging systems may suffer when patterning features at small dimensions.

Innovative process solutions have been developed that overcome some of these limitations. However, many such process solutions also interact with subsequent steps and may degrade other equally important factors. For example, process modifications made, in the printing of minimum features during the lithography steps can seriously impact transistor performance or product yield.

What are needed in the art are methods of leveraging lithographic techniques to print finer features to enable continued scaling without impacting product performance or process yield.

SUMMARY OF THE INVENTION

These and other problems are generally solved or circumvented, and technical advantages are generally achieved, by preferred embodiments of the present invention, which provide integrated circuits, and methods of design and manufacture thereof. In accordance with an embodiment of the present invention, a method of manufacturing includes depositing a gate material over a semiconductor substrate, and depositing a first composite layer over the gate material. At least one first mask is used to pattern the first composite layer to form first and second features. The first features comprise patterns for the semiconductor device and the second features comprise printing assist features. At least one second mask is used to remove the second features from the first composite layer.

The foregoing has outlined rather broadly features of embodiments of the present invention in order that the detailed description of the invention that follows may be better understood. Additional features and advantages of embodiments of the invention will be described hereinafter, which form the subject of the claims of the invention. It should be appreciated by those skilled in the art that the conception and specific embodiments disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the present invention, and the advantages thereof, reference is now made to the following descriptions taken in conjunction with the accompanying drawings, in which:

FIGS. 1a and 1b illustrate an embodiment of an integrated circuit, wherein FIG. 1a illustrates a cross-sectional view of a stacked gate transistor and FIG. 1b illustrates a cross-sectional view of an isolated transistor;

FIGS. 2a and 2b illustrate top views of lithography mask layers in accordance with an embodiment of the present invention, wherein FIG. 2a illustrates a first mask layer and FIG. 2b illustrates a second mask or erase mask layer;

FIGS. 3a-3i illustrate cross-sectional views of a region of an integrated circuit during various process steps of manufacturing using embodiments of the invention;

FIGS. 5a and 5b illustrate top views of lithography mask layers in accordance with an embodiment of the present invention, wherein FIG. 5a illustrates a first mask layer and FIG. 5b illustrates a second mask or erase mask layer;

FIGS. 6a-6j illustrate cross-sectional views of a region of an integrated circuit during various process steps of manufacturing using embodiments of the invention;

FIGS. 8a-8g illustrate cross-sectional views of a region of an integrated circuit during various process steps of manufacturing using embodiments of the invention;

FIG. 10, which includes

FIG. 11, which includes FIGS. 11a-11e, illustrates a top view of gate lines, wherein FIGS. 11a and 11c illustrate gate lines formed in a single exposure and FIGS. 11b and 11d illustrate gate lines formed in accordance with embodiments of the invention; and FIG. 12, which includes

Corresponding numerals and symbols in the different figures generally refer to corresponding parts unless otherwise indicated. The figures are drawn to clearly illustrate the relevant aspects of the preferred embodiments and are not necessarily drawn to scale.

DETAILED DESCRIPTION OF ILLUSTRATIVE EMBODIMENTS

Figure 2A:
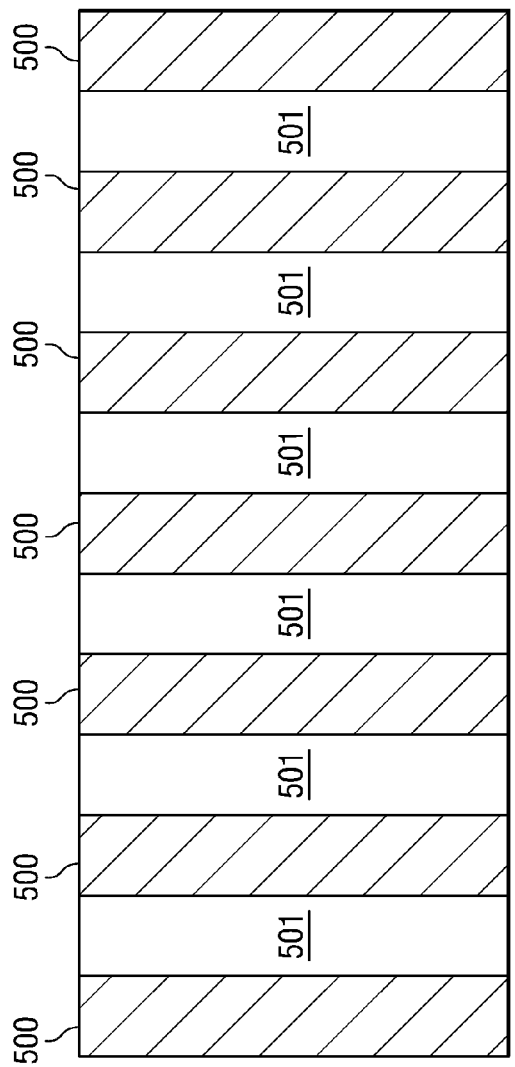

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

A phenomenon referred to as proximity effect poses a primary challenge in transferring patterns during lithography. Proximity effects result in variation of line width of patterns, depending on the proximity of a feature to other features. Proximity effects arise during, for example, imaging, resist patterning, or subsequent transferring of the pattern, such as during etching. To first order, the magnitude of the effect typically depends on the proximity or closeness of the two features present on the mask. However, proximity effects can extend to longer distances extending to several micrometers especially for etch processes.

One of the reasons for the observed proximity effects arises from optical diffraction. Hence, adjacent features interact with one another to produce pattern-dependent variations. For example, for lithographic exposure, closely-spaced dark features (densely packed gates) tend to be wider into a positive tone resist than widely-spaced features (for example isolated gates), although on a lithography mask they comprise the same dimension. Similarly, during etch processes, the reverse is true, and hence closely-spaced features tend to be transferred smaller than widely-spaced features. It is important in many semiconductor device designs for features to have uniform, predictable dimensions across a surface of a wafer, for example, to achieve the required device performance.

To compensate for such proximity effects, optical proximity corrections (OPC) are applied to mask layouts of lithographic photomasks, which may involve adjusting the widths or lengths of the lines on the mask. Advanced methods of OPC correct corner rounding and a general loss of fidelity in the shape of features by adding small secondary patterns, referred to as serifs, to the patterns.

Finally, sub-resolution assist features, also called scatter bars, are also added, which are features formed on the mask but are not patterned or printed. For example, sub-resolution assist features typically comprise a plurality of lines significantly thinner than the minimum patternable width or resolution of the exposure tool. These assist features effectively change the pattern density and help improve depth of focus of the exposure system. Consequently, these assist features improve uniformity in printing features of different density, for example, between isolated and dense lines.

The use of scatter bars, however, is becoming increasingly difficult to implement. For example, the width of the scatter bars must be significantly smaller than the critical dimension of the minimum feature to avoid printing. Shrinking the critical dimension also requires shrinking the widths of scatter bars. Thus, increasing the difficulty of incorporating these features into the mask, as well as their subsequent inspection and repairs.

Further, the patterning of ever shrinking minimum features and especially pitches requires aggressive increases in numerical aperture of the lithography system. Although higher numerical aperture increases resolution, the depth of focus degrades considerably. Consequently, the inclusion of sub-resolution assist features is not sufficient to improve depth of focus to a reasonable range suitable for production of future semiconductor nodes. However, further improvements in depth of focus can be made if the sub-resolution assist features are allowed to print. Such features, also called printing assist features, are now being explored.

Printing assist features, also called dummy features, are typically introduced in the layout to improve the quality of the transfer of neighboring, electrically active gates. These dummy features (if gate lines, dummy gates) would be transferred to the final chip layout on the wafer just like the neighboring, electrically active gates. For example, additional gate lines may be printed, for example, over isolation regions. Such dummy gate lines reduce the difference in pitch between wider and narrower pitch structures. However, the use of such dummy features introduces drawbacks due to the presence of these structures in the final layout or produced chip. For example, the presence of these additional dummy structures may, in some cases, reduce the electrical performance of the chip. Similarly, dummy gate lines formed in source or drain regions hamper formation of contacts, thus restricting their use.

Another method of advantageously using printing assist features is provided by a technique called double patterning. In double patterning, the mask contains a number of additional features. These additional features such as dummy gate lines are printed along with critical features. The additional features are removed in a subsequent process step by exposing these additional features to a second mask step.

The use of printing assist features enables optimization of lithography process conditions to increase the common process window. For example, densely packed gates can be patterned in regions assigned to form both isolated transistors and densely packed transistor arrays. Hence, the isolated transistor region comprises the active gate line and a plurality of printing assist features or dummy gate lines. Isolated transistors are subsequently formed by removal of these dummy gate lines.

In the typical double patterning process, all the additional features are removed during the second process step. However, removal of printing assist features may introduce deleterious features. For example, the etch process used to remove the gate electrode may punch through the thin gate dielectric layer underneath exposing the silicon underneath. Thus, the silicon moat or isolation region underneath the dummy gate line may be etched. Further, this undesired etching of the silicon or isolation region may depend on pattern density. For example, regions removing multiple dummy gate lines may remove more silicon compared to regions removing only a few dummy gate lines. Hence, a double patterning process that does not introduce deleterious features is needed.

One embodiment of this invention provides a method to remove printing assist features, while minimizing deleterious effects arising from removal of these printing assist features. In various embodiments, the method achieves this by forming a template of the desired features on a composite layer. The printing assist features are removed from this composite layer before forming the final patterned gate stack layer, and preventing the need to etch printing assist features from over the thin gate dielectric layer.

Embodiments of the present invention achieve technical advantages by providing a method to simultaneously increase process margin, yield and product performance using double patterning techniques. The present invention will be described with respect to preferred embodiments in a specific context, namely removing printing assist features in field effect devices. The invention may also be applied, however, to other types of devices that require patterning features such as diodes, bipolar junction transistors, thyristors, and memory devices such as DRAM, FeRAM, phase change memories, or floating gate devices. Similarly, the invention may also be applied to other types of devices in other applications and other technological fields. Embodiments of the invention may be implemented in many types of semiconductor devices, such as logic, memory, peripheral circuitry, power applications, and other types of semiconductor devices, as examples.

An integrated circuit manufactured using embodiments of the invention is shown in FIG. 1. A mask for forming the semiconductor device is shown in FIG. 2 and additional embodiments of the mask are illustrated in FIGS. 5 and 10 in accordance with embodiments of the invention. A method of fabricating the integrated circuit using embodiments of the invention will be described with respect to the cross-sectional views of FIGS. 3a-3i, and the flow chart of FIG. 4. Additional methods of fabricating will then be described with respect to the cross-sectional views of FIGS. 6a-6j and 8a-8g, and the flow charts of FIGS. 7 and 9, in accordance with embodiments of the invention. Advantages of using embodiments of the invention will be described using FIG. 10. The dual patterning process described in various embodiments is then compared with a single exposure process in FIG. 11.

FIGS. 1a and 1b illustrate cross-sectional views of semiconductor devices manufactured in accordance with an embodiment of the present invention. FIG. 1a illustrates a stacked or nested transistor, whereas FIG. 1b illustrates an isolated transistor. With reference now to FIGS. 1a and 1b, the transistor regions 100 and 200 comprise transistor arrays 100a containing transistors 101-104 and individual transistors 201 and 202 disposed between isolation regions 26 in a substrate 99. The silicon area of region 100 typically contains a plurality of transistors (stacked transistors) of a given critical dimension L. The distance $p_1$ between the transistors in the region 100 determines the pitch. If this distance $p_1$ approaches the smallest allowed distance for the given technology, the transistors 101-104 are also called minimum pitch stacked transistors. The silicon area of region 200 contains sufficient area for single transistors also called an isolated transistor. The isolated transistors typically are also separated from each other by a fixed distance or pitch. For example, in FIG. 1b, the distance $p_2$ separates the two isolated transistors 201 and 202. A typical integrated circuit contains both minimum pitch transistors, such as transistors 101-104, and isolated transistors, such as transistor 201. The integrated circuit also typically comprises intermediate pitch stacked transistors that may be less densely packed than the minimum pitch stacked transistors.

The transistors 101-104 and 201-202 comprise channel regions 18 disposed in active regions 1, gate stack layer 10 or gate electrodes, an isolating material forming isolation regions 26, source/drain regions 55/57, and spacers 38. A strain inducing etch stop layer is also present over the source 55, drain 57, gate dielectric 71 and gate stack layer 10, although this may not be a strain layer in some embodiments. Further, the gate stack layer 10 is formed adjacent to dummy gate lines 20 (e.g., in FIG. 1b). The effective gate pitch defined as the distance between adjacent gate lines (gate stack layer 10 to another gate stack layer 10 or between a gate stack layer 10 and dummy gate line 20) is typically optimized for subsequent processing or for transistor performance. The transistors in the two regions 100 and 200 are formed identically except for locations and pitch of gate stack layer 10 and dummy gate lines 20.

Figure 2B:
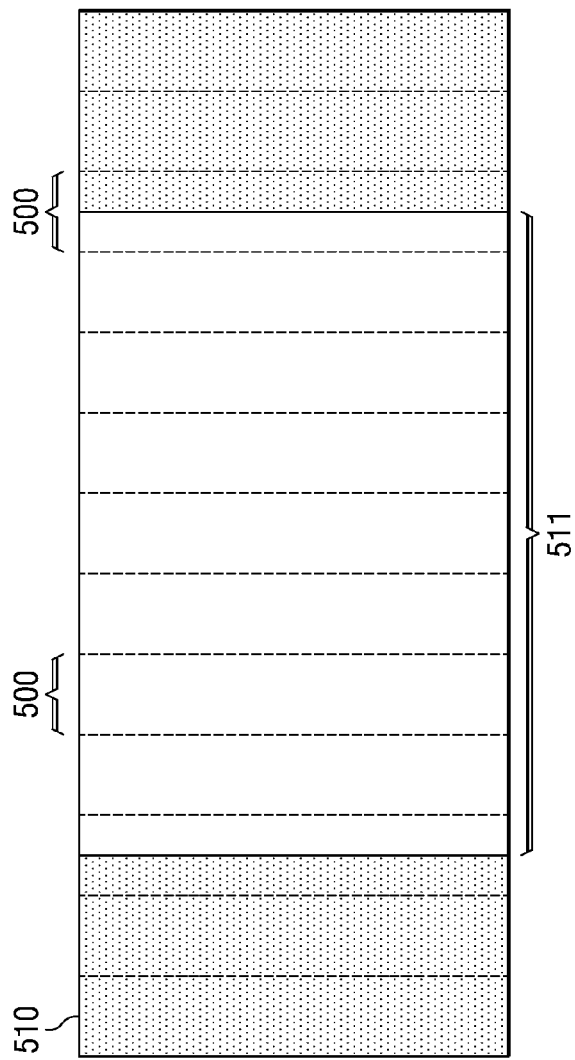

FIGS. 2a and 2b provide illustrations of a mask used in the double patterning process to manufacture, for example, the transistor regions 100 (in FIG. 1a). As discussed earlier, a typical double patterning process comprises a first exposure, develop and etch followed by a second exposure, develop and etch, forming the final pattern. In particular, FIG. 2a shows a first mask level 499 used in the formation of the first exposure. FIGS. 2a and 2b also show the areas forming the transistor regions 100 (in FIG. 1a). The first exposure comprises openings 500 in the mask exposing the photo-resist. The opaque regions 501 block radiation and hence are not developed. The first exposure is used to pattern gate lines as well as form printing assist features. The illumination conditions are selected to maximize the image quality, for example, minimize across chip line width variation, over a range of process window parameters such as depth of focus, exposure dose and mask error factor.

A second mask, as shown by the second mask level 509 over the transistor regions 100 (in FIG. 1a), exposes transparent regions 510 selectively. The second mask is an erase or cut mask in that it removes selected regions (transparent regions 510). For example, the second mask level 509 contains transparent regions 510 and opaque regions 511 that block exposure of any underlying resist. For clarity, FIG. 2b also illustrates the positioning of openings 500 (illustrated by dashed lines) from the first mask level 499. The combination of the first and second exposure results in removal of printing assist features as described in various embodiments.

By minimizing variation in spacings and openings of printing during the stringent first mask step, variations due to pattern density are minimized. As second mask level 509 is an erase mask, it does not need as stringent requirements as the first mask level 499.

The mask design has been explained in terms of opaque and transparent regions to clearly describe the embodiments of the invention. However, actual mask design and materials can be chosen to incorporate modifications to improve the imaging system. For example, to improve image resolution, the mask design may comprise attenuated phase shifter materials in opaque regions 501 and transparent materials in openings 500 of FIG. 2a. Similarly, to improve depth of focus, the mask design for each layer may comprise OPC features such as hammerheads, serifs, sub-resolution assist features, etc. Further, although a positive resist has been assumed, the transistor regions 100 and 200 of FIG. 1 can be fabricated using a negative resist (the mask design could be suitably adjusted).

FIGS. 3a-3i provide cross-sectional diagrams illustrating an embodiment method of the present invention using the first mask level 499 and the second mask level 509 of FIG. 2. FIG. 4 illustrates an associated flow diagram of one implementation of the process. For clarity, the process flows and features of FIG. 3 illustrate only one type of transistor region (e.g., regions 100 of FIG. 1a). While certain details may be explained with respect to only one of the embodiments, it is understood that these details can also apply to other ones of the embodiments.

Figure 3A:
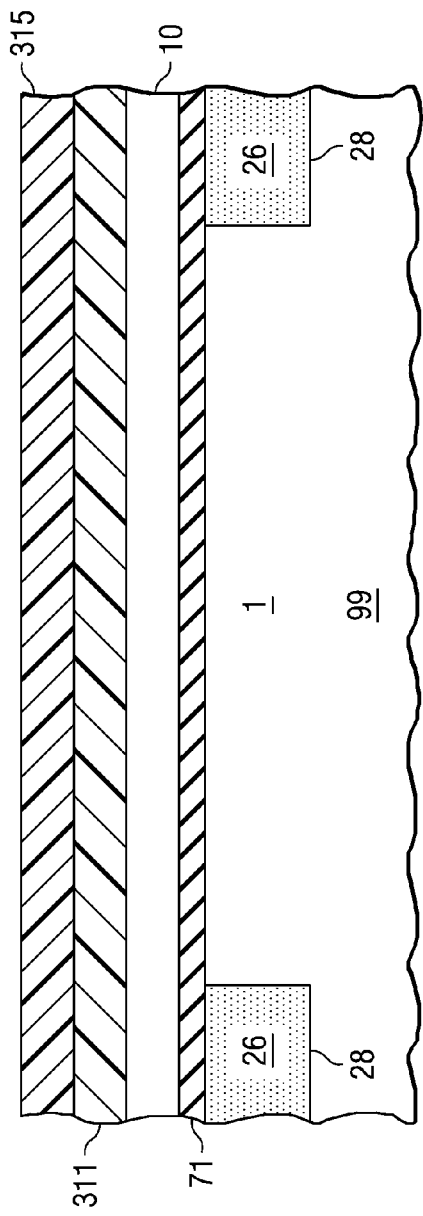
Figure 4:
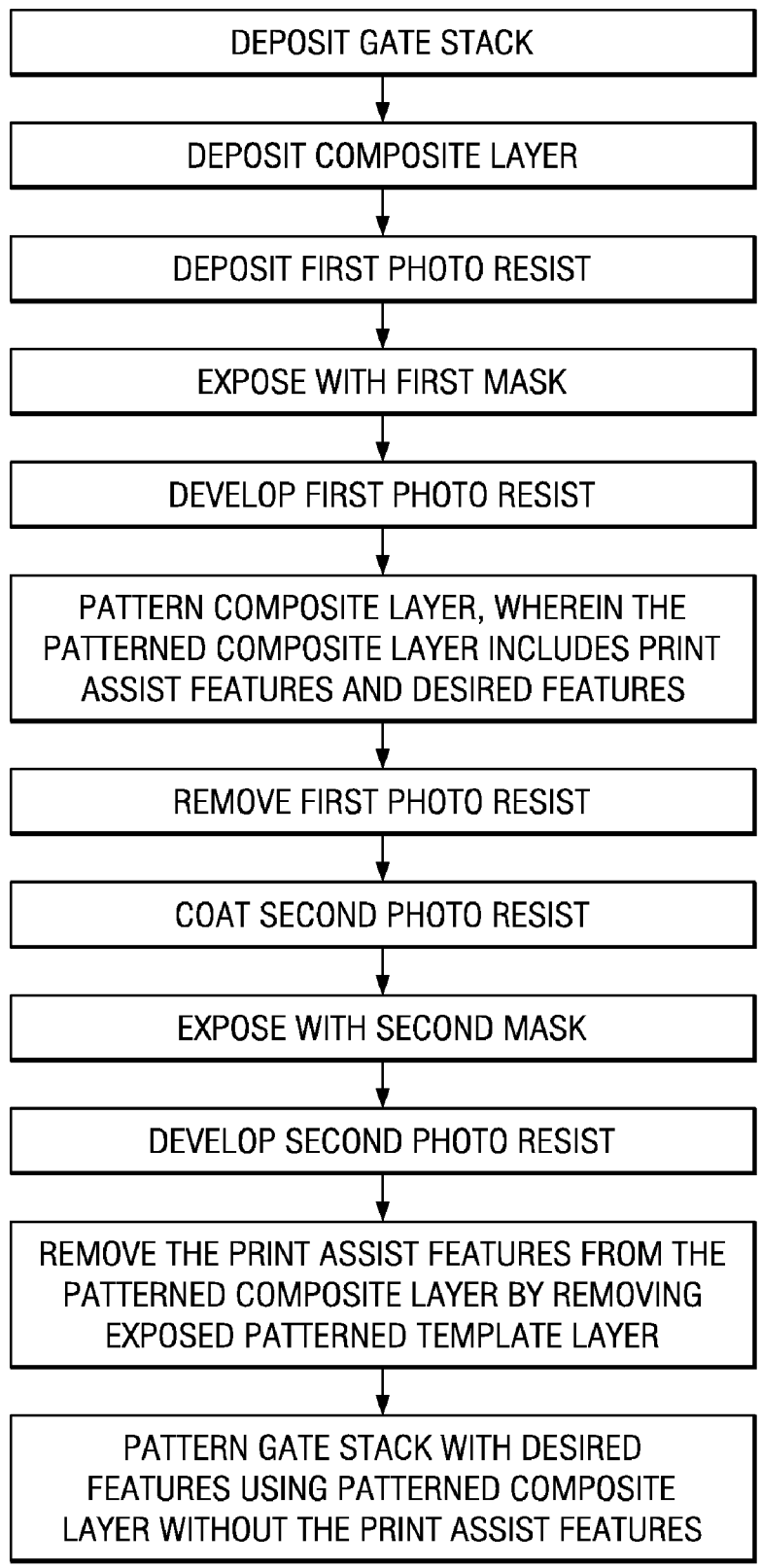
FIG. 4 illustrates a flow chart of the process steps of manufacturing an integrated circuit in accordance with an embodiment of the invention.

Referring first to FIG. 3a, a substrate 99 is provided. In the preferred embodiment, the substrate 99 is a silicon wafer.

Some examples of the substrate 99 are a bulk mono-crystalline silicon substrate (or a layer grown thereon or otherwise formed therein), a layer of (110) silicon on a (100) silicon wafer, a layer of a silicon-on-insulator (SOI) wafer, or a layer of a germanium-on-insulator (GeOI) wafer. In other embodiments, other semiconductors, such as silicon germanium, germanium, gallium arsenide, indium arsenide, indium gallium arsenide, indium antimonide or others, can be used with the wafer.

Referring to FIG. 3a, trenches 28 for isolation are formed in the substrate 99. The trenches 28 can be formed using conventional techniques. The trenches 28 define active region 1, in which integrated circuit components can be formed. The trenches 28 are then filled with an isolating material forming isolation regions 26. The trench fill can be a single material or multiple materials. Examples of trench fill materials include oxides such as thermal oxide, High Density Plasma (HDP) oxide, HARP oxide, TEOS oxides and various nitrides. In other embodiments, other trench filling processes can be used. For example, while the trench is typically lined, this step can be avoided with newer fill materials (for example HARP™). The top surface of the substrate 99 is subsequently polished and planarized. Chemical mechanical polishing (CMP) is a specific example of the polishing process. This completes the formation of the isolation regions 26.

FIG. 3a shows the device after gate stack deposition. After STI formation, well, punch through and threshold implants are performed, a gate dielectric 71 is deposited over exposed portions of the substrate 99. In one embodiment, the gate dielectric 71 comprises an oxide (e.g., $SiO_2$), a nitride (e.g., $Si_3N_4$), or a combination of oxide and nitride (e.g., SiON or an oxide-nitride-oxide sequence). In other embodiments, a high-k dielectric material having a dielectric constant of about 5.0 or greater is used as the gate dielectric 71. Suitable high-k materials include $HfO_2$, $HfSiO_x$, $Al_2O_3$, $ZrO_2$, $ZrSiO_x$, $Ta_2O_5$, $La_2O_3$, nitrides thereof, $HfAlO_x$, $HfAlO_xN_{1-x-y}$, $ZrAlO_x$, $ZrAlO_xN_y$, $SiAlO_x$, $SiAlO_xN_{1-x-y}$, $HfSiAlO_x$, $HfSiAlO_xN_y$, $ZrSiAlO_x$, $ZrSiAlO_xN_y$, combinations thereof, or combinations thereof with $SiO_2$, as examples. Alternatively, the gate dielectric 71 can comprise other high-k insulating materials or other dielectric materials. As implied above, the gate dielectric 71 may comprise a single layer of material, or alternatively, the gate dielectric 71 may comprise two or more layers.

The gate dielectric 71 may be deposited by chemical vapor deposition (CVD), atomic layer deposition (ALD), metal organic chemical vapor deposition (MOCVD), physical vapor deposition (PVD), or jet vapor deposition (JVD), as examples. In other embodiments, the gate dielectric 71 may be deposited using other suitable deposition techniques. The gate dielectric 71 preferably comprises a thickness of about 10 Å to about 60 Å in one embodiment, although alternatively, the gate dielectric 71 may comprise other dimensions. In the illustrated embodiment, the same dielectric layer would be used to form the gate dielectric 71 for both the p-channel and n-channel transistors. This feature is however not required. In alternate embodiments, p-channel transistors and n-channel transistors could each have different gate dielectrics.

The gate stack layer 10 is formed over the gate dielectric 71. The gate stack layer 10 preferably comprises a semiconductor material, such as polysilicon or amorphous silicon, although alternatively, other semiconductor materials may be used for the gate stack layer 10. In other embodiments, the gate stack layer 10 may comprise TiN, TiC, HfN, TaN, TaC, W, Al, Ru, RuTa, TaSiN, $NiSi_x$, $CoSi_x$, $TiSi_x$, Ir, Y, Pt, Ti, PtTi, Pd, Re, Rh, borides, phosphides, or antimonides of Ti, Hf, Zr, TiAlN, Mo, MoN, ZrSiN, ZrN, HfN, HfSiN, WN, Ni, Pr, VN, TiW, a partially silicided gate material, a fully silicided gate material (FUSI), other metals, and/or combinations thereof, as examples. In one embodiment, the gate stack layer 10 comprises a doped polysilicon layer underlying a silicide layer (e.g., titanium silicide, nickel silicide, tantalum silicide, cobalt silicide, or platinum silicide).

The gate stack layer 10 may comprise a plurality of stacked gate materials, such as a metal underlayer with a polysilicon cap layer disposed over the metal underlayer. In one embodiment, the gate stack layer 10 comprises a metal underlayer and a sacrificial polysilicon cap layer. A gate stack layer 10 having a thickness of between about 400 Å to 2000 Å may be deposited using CVD, PVD, ALD, or other deposition techniques.

A composite layer 311 is deposited over the gate stack layer 10. The composite layer 311 in different embodiments comprises silicon dioxide, silicon nitride, silicon oxy-nitride, titanium nitride, silicon containing ARC layer, amorphous carbon layer and/or a SiLK™ (silicon-containing low-k) layer. Although only a single layer of the composite layer 311 is shown, the composite layer 311 may comprise multiple layers. For example, in some embodiments, the composite layer 311 may be a bilayer or trilayer film comprising different materials. In one embodiment, the composite layer 311 comprises a bottom hard mask layer disposed below an organic layer, for example, a bottom anti-reflective coating (BARC) layer.

A first photo-resist layer 315 is deposited over the composite layer 311. The first photo-resist layer 315 is a resist that can be developed by exposure to radiation such as deep UV radiation used by lithography systems. In preferred embodiments, this first photo-resist layer 315 is sensitive to 193 nm, 157 nm or extreme ultraviolet electromagnetic radiation. The resist used may either be positive or negative. Examples of resist polymers are poly-p-hydroxystyrene, acrylates, novolak or cycloaliphatic copolymers.

Figure 3B:
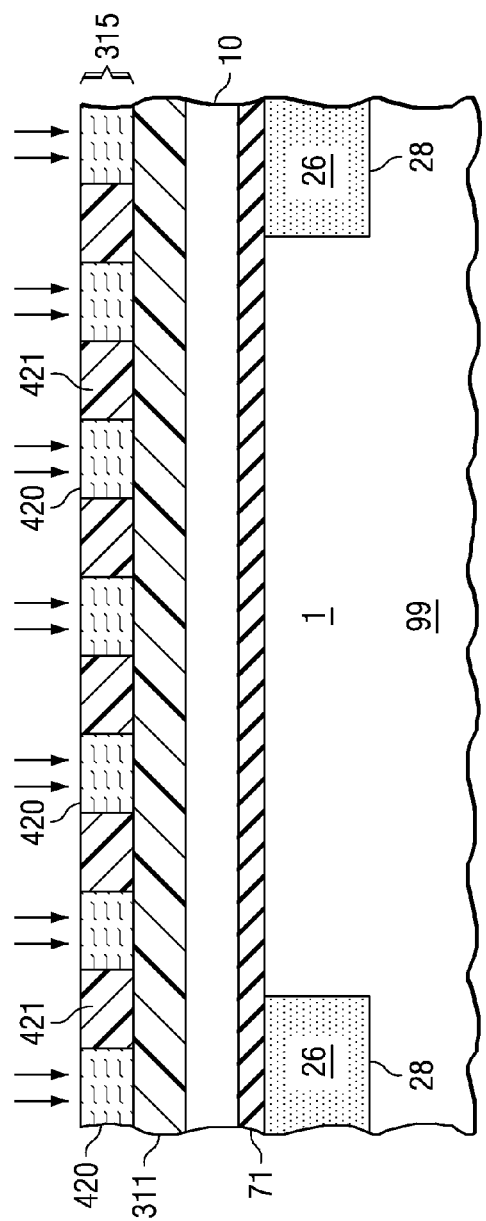

Referring to FIG. 3b, the first photo-resist layer 315 is exposed using the first mask level 499 of FIG. 2a. The first mask level 499 of FIG. 2a comprises the desired gate features, but also includes the additional printing assist features. Thus, the regions exposed by the lithography (first exposed regions 420), whereas some regions remain unexposed (first unexposed regions 421).

Figure 3C:
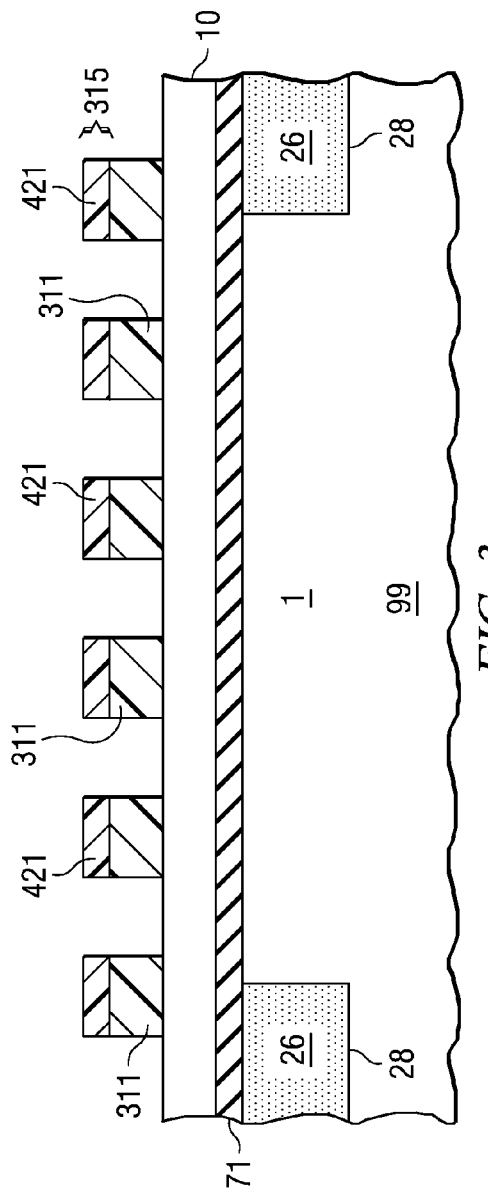
Figure 3D:
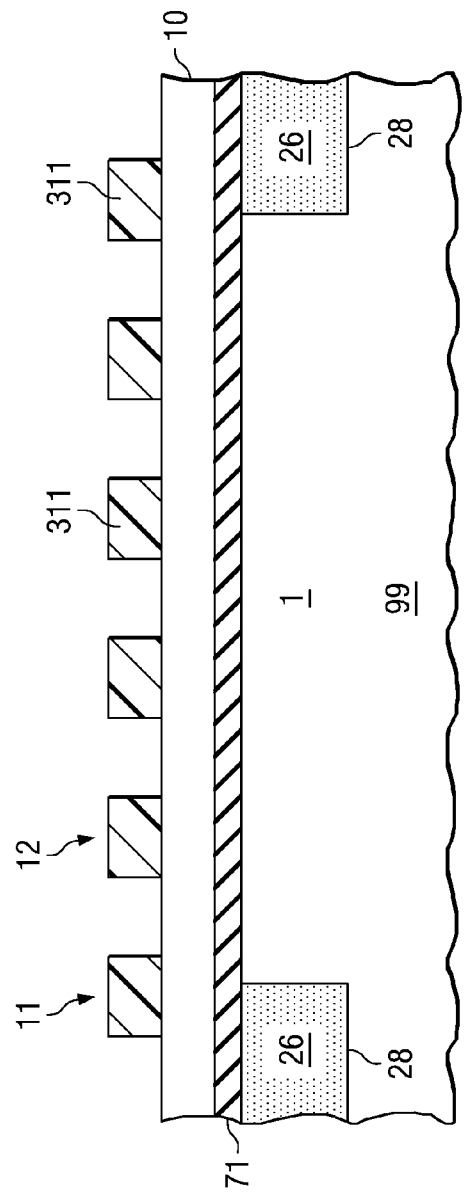

Next, the composite layer 311 is patterned to form a template comprising features for forming printing assist features and desired gate features. Referring to FIG. 3c, the first exposed regions 420 are removed by etching. Using the first unexposed regions 421 as patterns, an anisotropic etch (e.g., a reactive ion etch) is used to remove the exposed portion of the composite layer 311, thus forming the template. In different embodiments, a top portion of the gate stack layer 10 is etched and forms part of the template. Referring to FIG. 3d, the patterned first photo-resist layer 315 is etched off to expose the template comprising the patterned composite layer. This patterned composite layer includes patterns for both the desired features and additional printing assist features.

A second photo-resist layer 316 is coated over the substrate 99 covering the gate stack layer 10 as shown in FIG. 3e. Referring next to FIG. 3f, the second photo-resist layer 316 is exposed using the second mask level 509 of FIG. 2b, thereby forming second exposed regions 430 and second unexposed regions 431.

The second exposed regions 430 are developed as shown in FIG. 3g. Further, the regions of the composite layer 311 are thus opened and also removed, for example, using a wet etch.

Thus the printing assist features are removed during this step. Next, the second photo-resist layer 316 is etched off thus forming a patterned composite layer 311 that includes only the desired features. Next, as shown in FIG. 3i, the pattern is transferred to gate stack layer 10 by a reactive ion etch. An additional trim etch may be performed at this stage to reduce the critical dimension of the gate stack layer 10 further, before removal of the composite layer 311. Finally, as shown in FIG. 3i, all the resist layers are removed forming the patterned gate stack layer 10.

After gate stack formation, further processing continues as per conventional flow. For example, spacers, extensions, source/drain regions, silicide regions, contacts and metallization including vias and metal lines may be formed completing the fabrication of the integrated circuit.

An embodiment of a method of manufacturing the integrated circuit will next be described using masks illustrated in FIG. 5. The integrated circuit in various stages of manufacturing will then be described in FIG. 6 and the flow chart of FIG. 7.

Figure 5A:
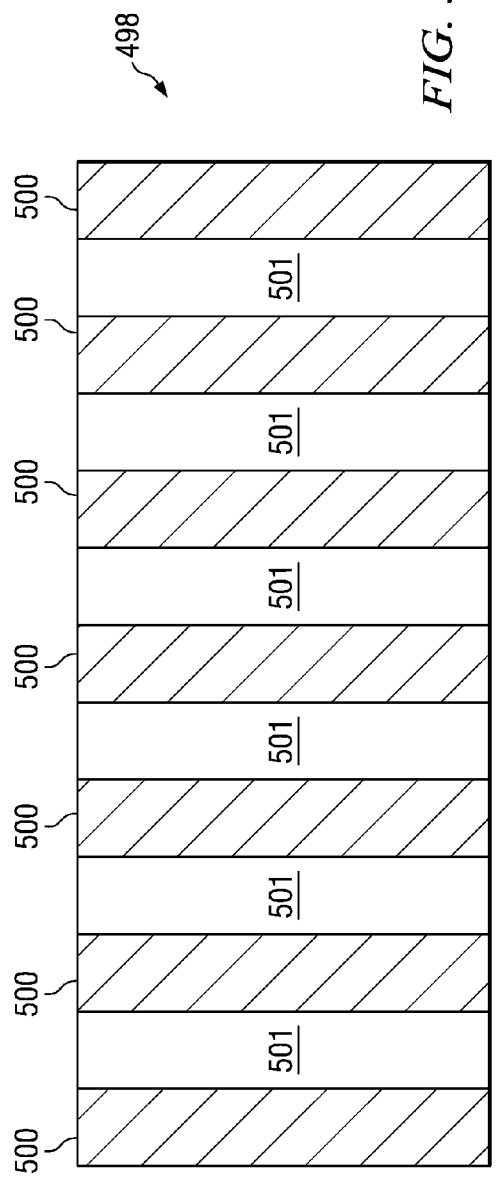
Figure 5B:
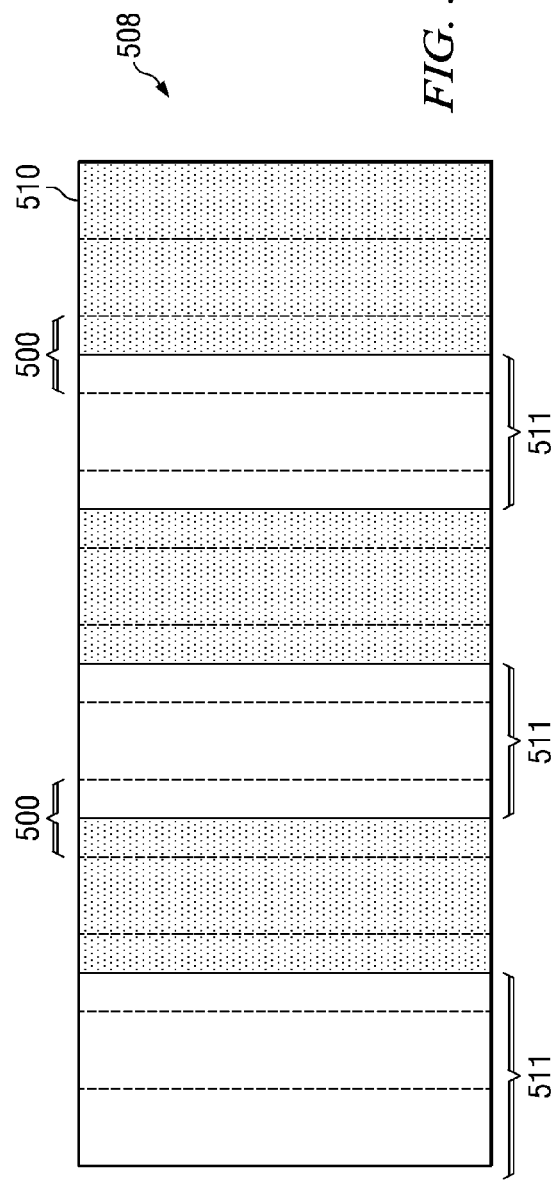

FIGS. 5a and 5b provide illustrations of a mask used in the double patterning process to manufacture, for example, the transistor regions 200 (in FIG. 1b). Similar to FIG. 2a, FIG. 5a shows a third mask level 498 used in the formation of the first exposure. The first exposure comprises openings 500 in the mask exposing the photo-resist. The regions 501 are opaque to radiation and hence are not developed. The first exposure is used to pattern gate lines as well as form printing assist features. A second mask, as shown by the fourth mask level 508 over the transistor regions 200 (in FIG. 1b) exposes regions 510 selectively. Similar to the second mask level 509, the fourth mask level 508 is an erase or cut mask in that it removes selected regions 510. For example, the fourth mask level 508 contains transparent mask regions 510 and opaque regions 511 that block exposure of any underlying resist. For clarity, FIG. 5b also illustrates the positioning of openings 500 (illustrated by dashed lines) from the third mask level 498. The combination of the third and fourth exposure results in removal of printing assist features as described in various embodiments.

FIGS. 6a-6j provide cross-sectional diagrams illustrating an embodiment method of the present invention using the third mask level 498 and the fourth mask level 508 of FIG. 5. FIG. 7 illustrates an associated flow diagram of one implementation of the process.

Referring, first to FIG. 6a, and as described in FIG. 3a, isolation regions 26 including trenches 28 for isolation are formed in a substrate 99. The top surface of the substrate 99 is subsequently polished and planarized. After STI formation, well, punch through and threshold implants are performed, a gate dielectric 71 is deposited over exposed portions of the substrate 99. A gate stack layer 10 is deposited over the gate dielectric 71. The gate stack layer 10 preferably comprises a semiconductor material, such as polysilicon or amorphous silicon or a metallic layer.

A composite layer 311 is deposited over the gate stack layer 10. In various embodiments, the composite layer 311 comprises oxide, nitrides, metals, or combinations thereof. Some examples of the composite layer 311 include silicon dioxide, silicon nitride, silicon oxy-nitride, titanium nitride, tantalum nitride, carbon, and silicon-carbon.

A first planarizing layer 312 is coated over the composite layer 311, and forms an anti-reflective coating layer. The first planarizing layer 312 also forms a planarized surface without additional polishing. However, in some embodiments, an additional planarization step may be performed using, for example, a chemical mechanical polishing process. The first planarizing layer 312 preferably comprises a planarizing spin on material such as a bottom anti-reflective coating material (BARC). The first planarizing layer 312 can also comprise another suitable organic underlayer of a trilayer resist stack used in advanced processing.

An optional first dielectric layer 313 is coated over the first planarizing layer 312. The first dielectric layer 313 comprises a spin on glass material and comprises silicon dioxide. The first dielectric layer 313 is coated at a low temperature to minimize damage of the underlying first planarizing layer 312.

A first photo-resist layer 315 is deposited on the first dielectric layer 313. The first photo-resist layer 315 is a resist that can be developed by exposure to radiation and preferably by 193 nm or by 157 nm (or extreme UV) electromagnetic radiation. The resist used may either be positive or negative. Examples of resist polymers are poly-p-hydroxystyrene, acrylates, novolak or cycloaliphatic copolymers.

Referring to FIG. 6b, the first photo-resist layer 315 is exposed using the third mask level 498 of FIG. 5a. The third mask level 498 of FIG. 5a comprises the desired gate features, but also includes the additional printing assist features. Thus, regions 420 are exposed whereas regions 421 remain unexposed.

Figure 6C:
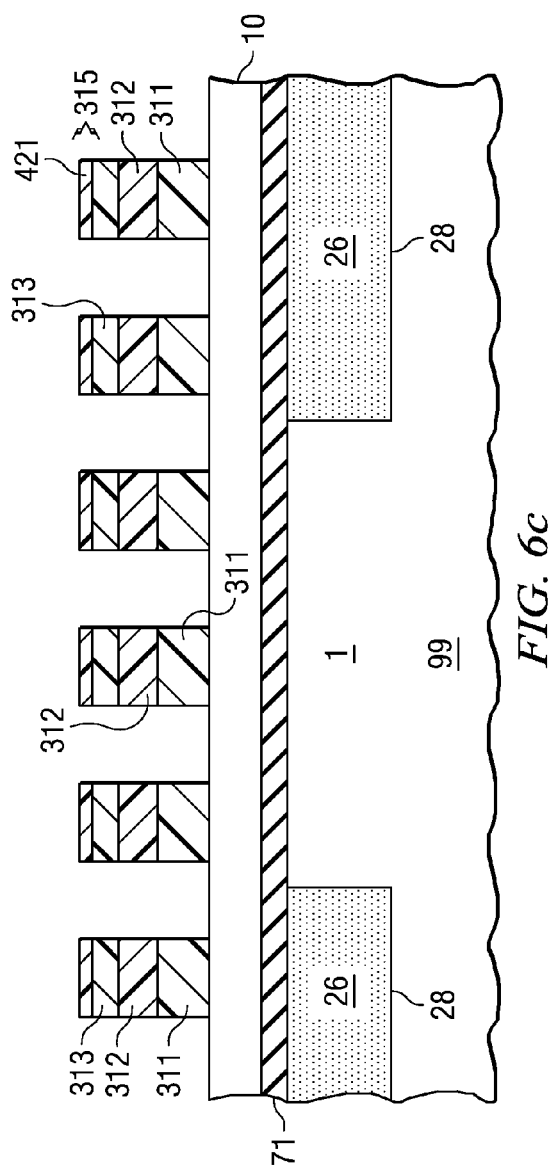
Figure 7:
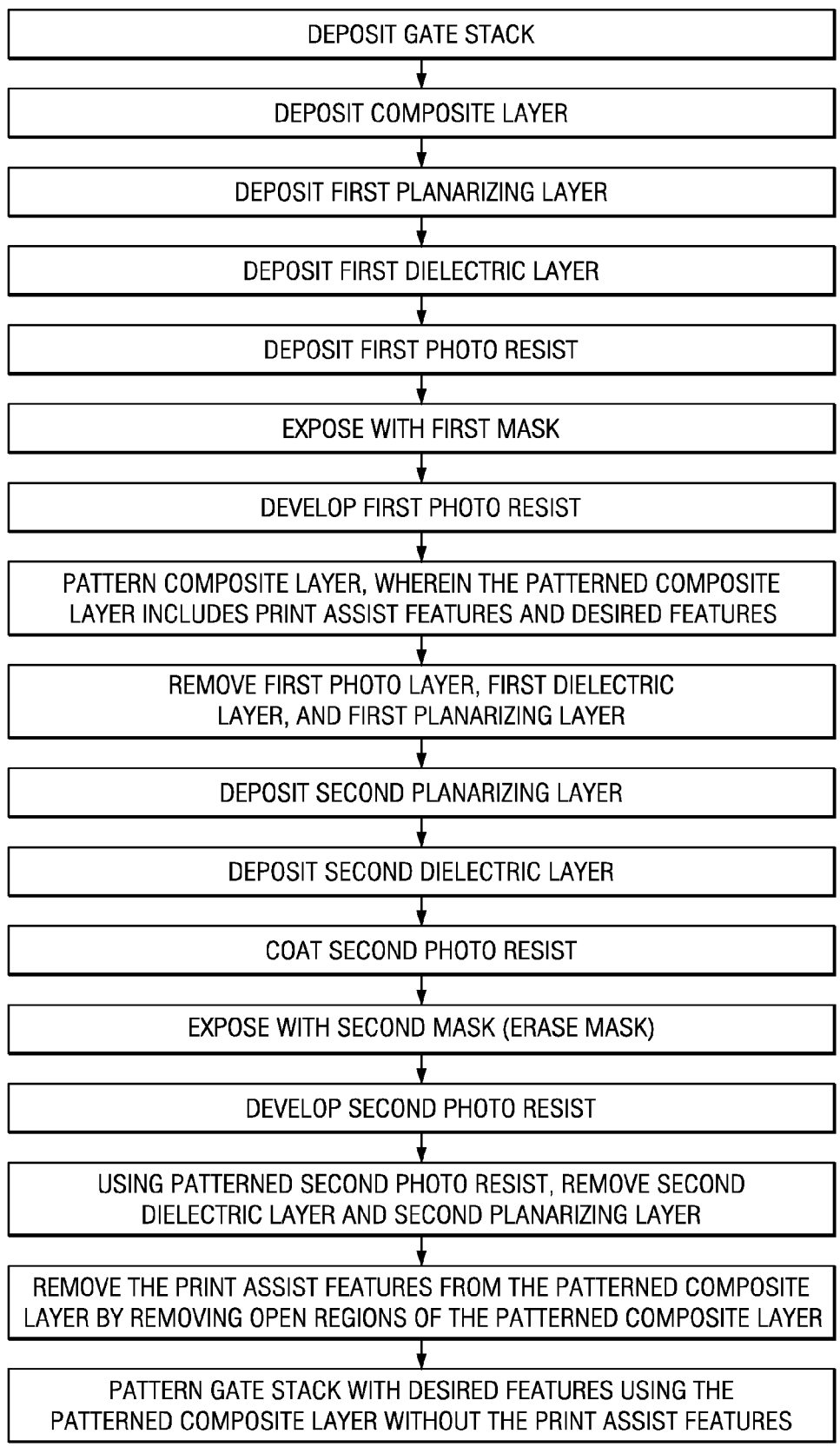
FIG. 7 illustrates a flow chart of the process steps of manufacturing an integrated circuit in accordance with an embodiment of the invention.

Referring to FIG. 6c, the first exposed regions 420 of the first photo-resist layer 315 are removed by etching. Using the first unexposed regions 421 as patterns, an anisotropic etch (e.g., a reactive ion etch) is used to remove the first dielectric layer 313 and the underlying first planarizing layer 312. In different embodiments, the etching to remove the first planarizing layer 312 may remove some or all the first photo-resist layer 315. With a mask comprising the first dielectric layer 313 and the underlying first planarizing layer 312, the composite layer 311 is etched.

Figure 6D:
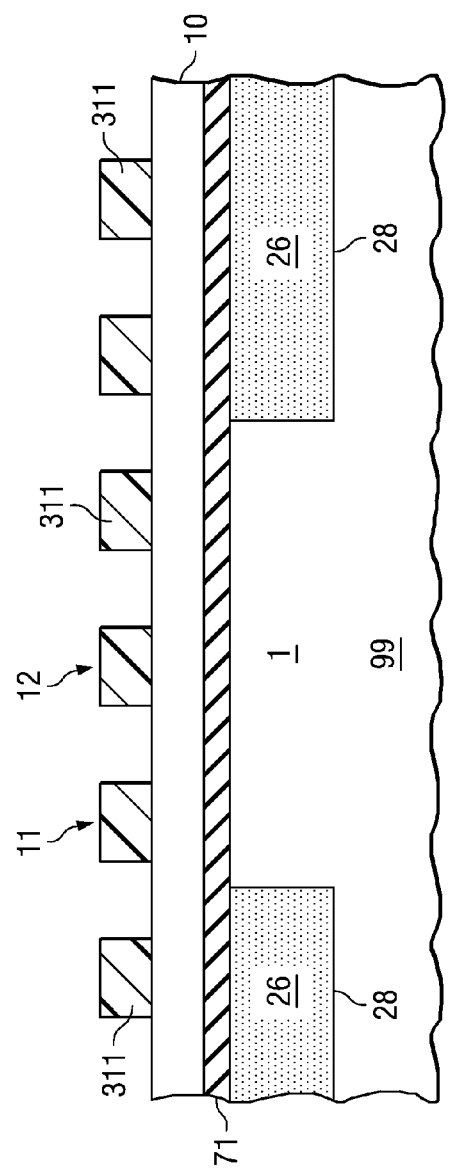

Referring to FIG. 6d, the patterned first photo-resist layer 315 (if remaining) is etched off. The first dielectric layer 313 and the first planarizing layer 312 are etched to expose the composite layer 311. The composite layer 311 thus patterned comprises a template that includes patterns for forming both desired features 12 and printing assist features 11.

Figure 6E:
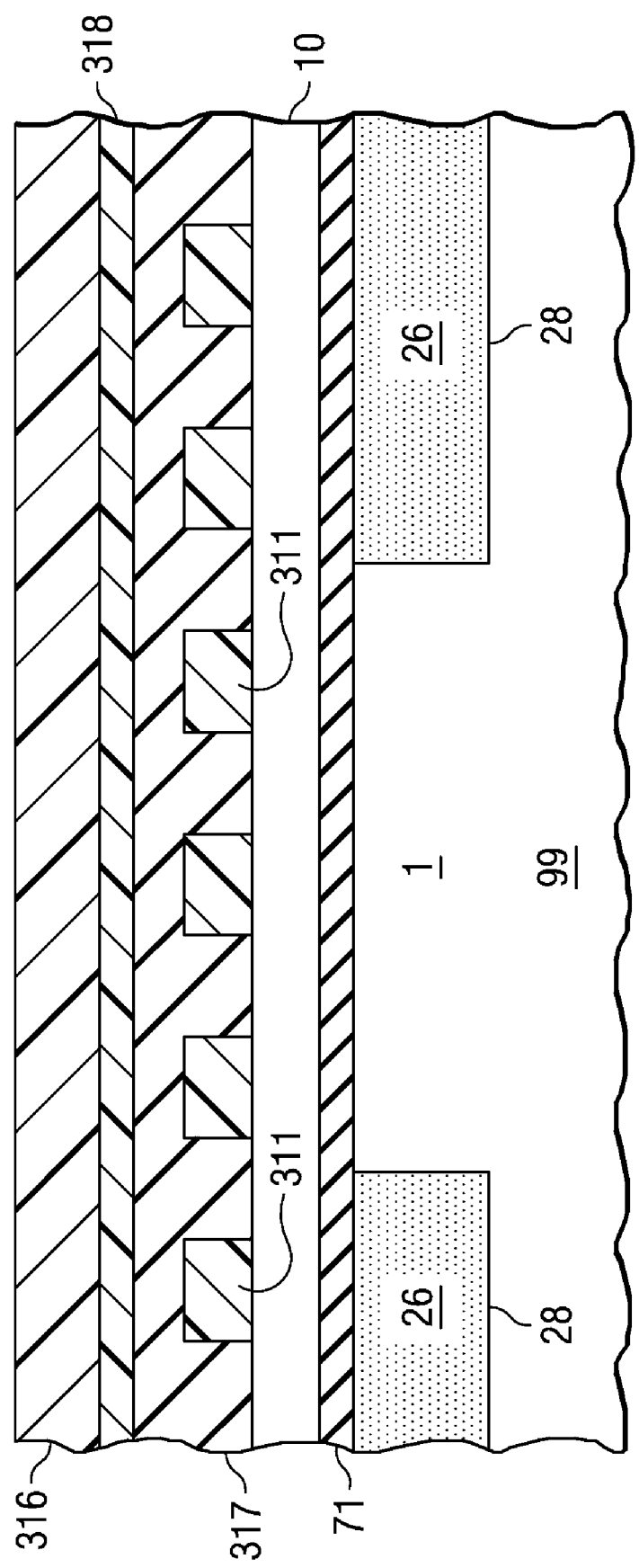

A second planarizing layer 317 is deposited over the composite layer 311, as illustrated in FIG. 6e. The second planarizing layer also fills in between the patterned composite layer 311, in between the desired features 12 and the printing assist features 11. The second planarizing layer 317 is preferably coated over the composite layer 311 to form a uniform surface. However, in some embodiments, an additional planarization step may be performed using, for example, a chemical mechanical polishing process. The second planarizing layer 317 preferably comprises a dielectric that forms a uniform layer during the deposition process or during a subsequent process such as a thermal step. The second planarizing layer 317 preferably comprises a planarizing spin on material such as bottom anti-reflective coating materials (BARC).

A second dielectric layer 318 is deposited over the second planarizing layer 317. The second dielectric layer 318 is optional, and in different embodiments is a part of a trilayer stack. The second dielectric layer 318 comprises a spin on glass material and comprises silicon dioxide. The second dielectric layer 318 is coated at a low temperature to minimize damage of the underlying second planarizing layer 317.

Figure 6F:
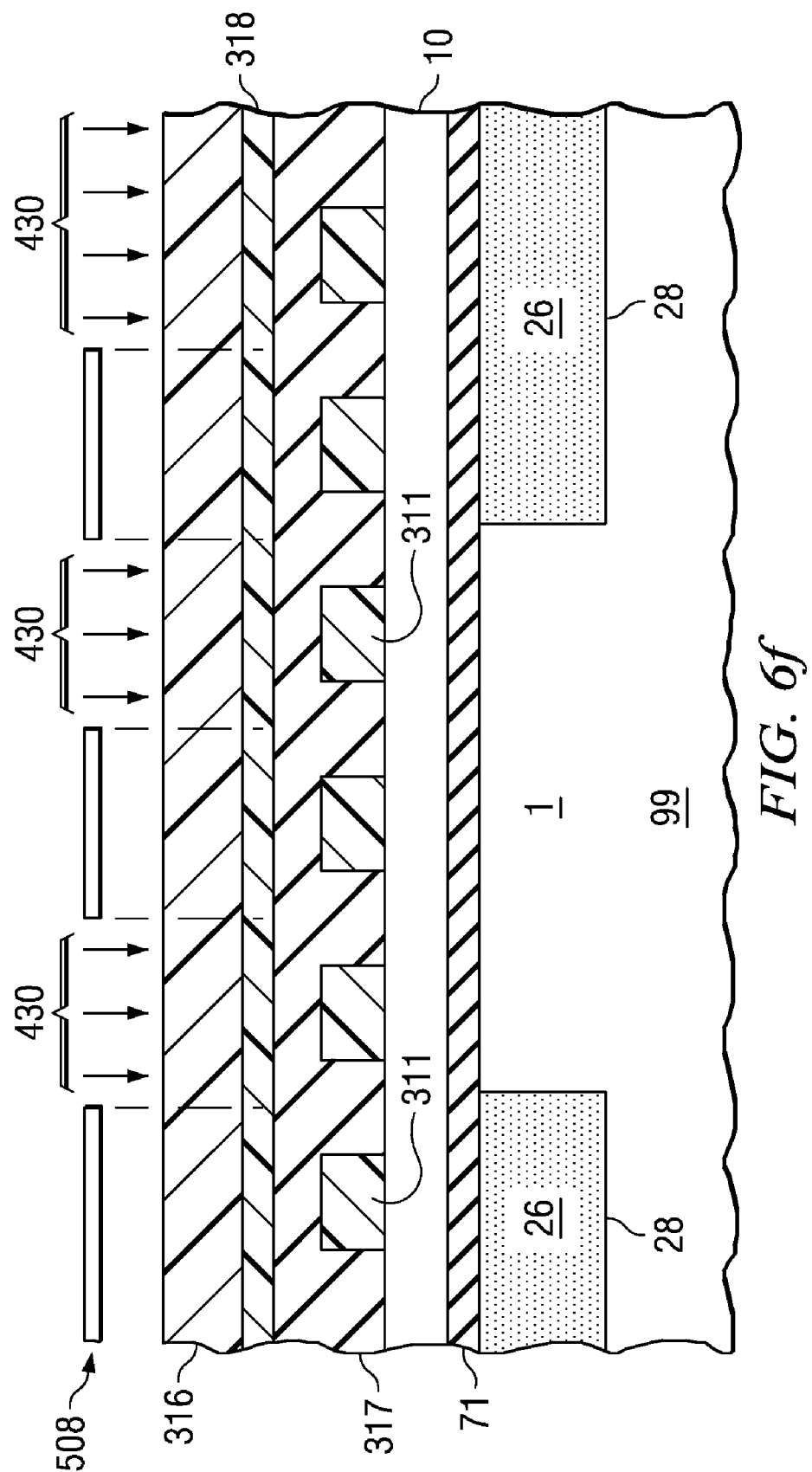

A second photo-resist layer 316 is coated over the substrate 99 covering the second dielectric layer 318 as shown in FIG. 6e. Referring next to FIG. 6f, the second photo-resist layer 316 is exposed using the fourth mask level 508 of FIG. 5b forming second exposed regions 430 and second unexposed regions 431.

The second exposed regions 430 are developed as shown in FIG. 6g. Further, using the second unexposed regions 431 as a mask, the regions of the second dielectric layer 318 and the second planarizing layer 317 thus opened are also removed, for example, using a wet etch. Finally, the open regions of the composite layer 311 are removed. In some embodiments, a top portion of the gate stack layer 10 is also removed in this step, after removing the composite layer 311. Thus, the printing assist features 11 are removed during this step. Next, any remaining second photo-resist layer 316 is stripped followed by removal of the second dielectric layer 318 and the second planarizing layer 317. Thus forming a patterned composite layer 311 that includes only the desired features 12 (FIG. 6h).

Next, as shown in FIG. 6i, the pattern is transferred to gate stack layer 10 by a reactive ion etching. Finally, as shown in FIG. 6j, all the resist layers are removed forming the patterned gate stack layer 10 comprising the desired features 12. Further processing continues as per conventional flow.

Figure 8A:
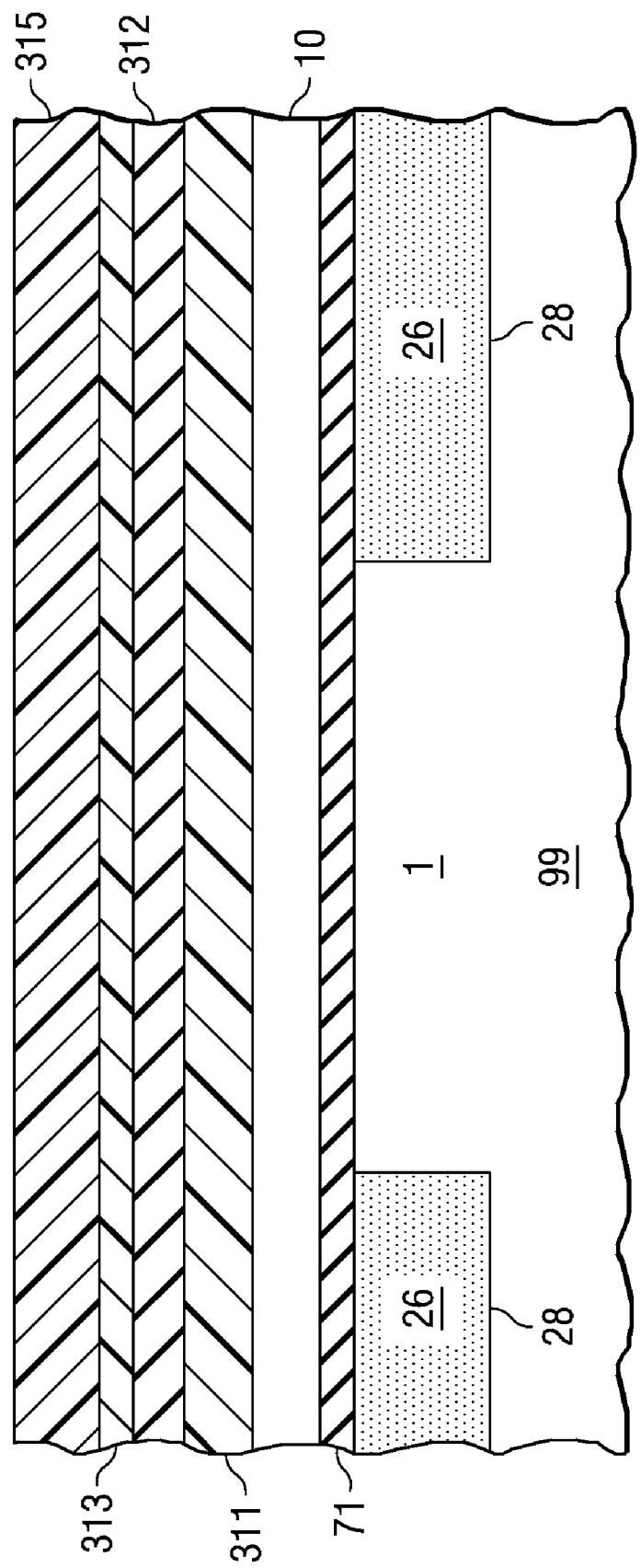
Figure 8B:
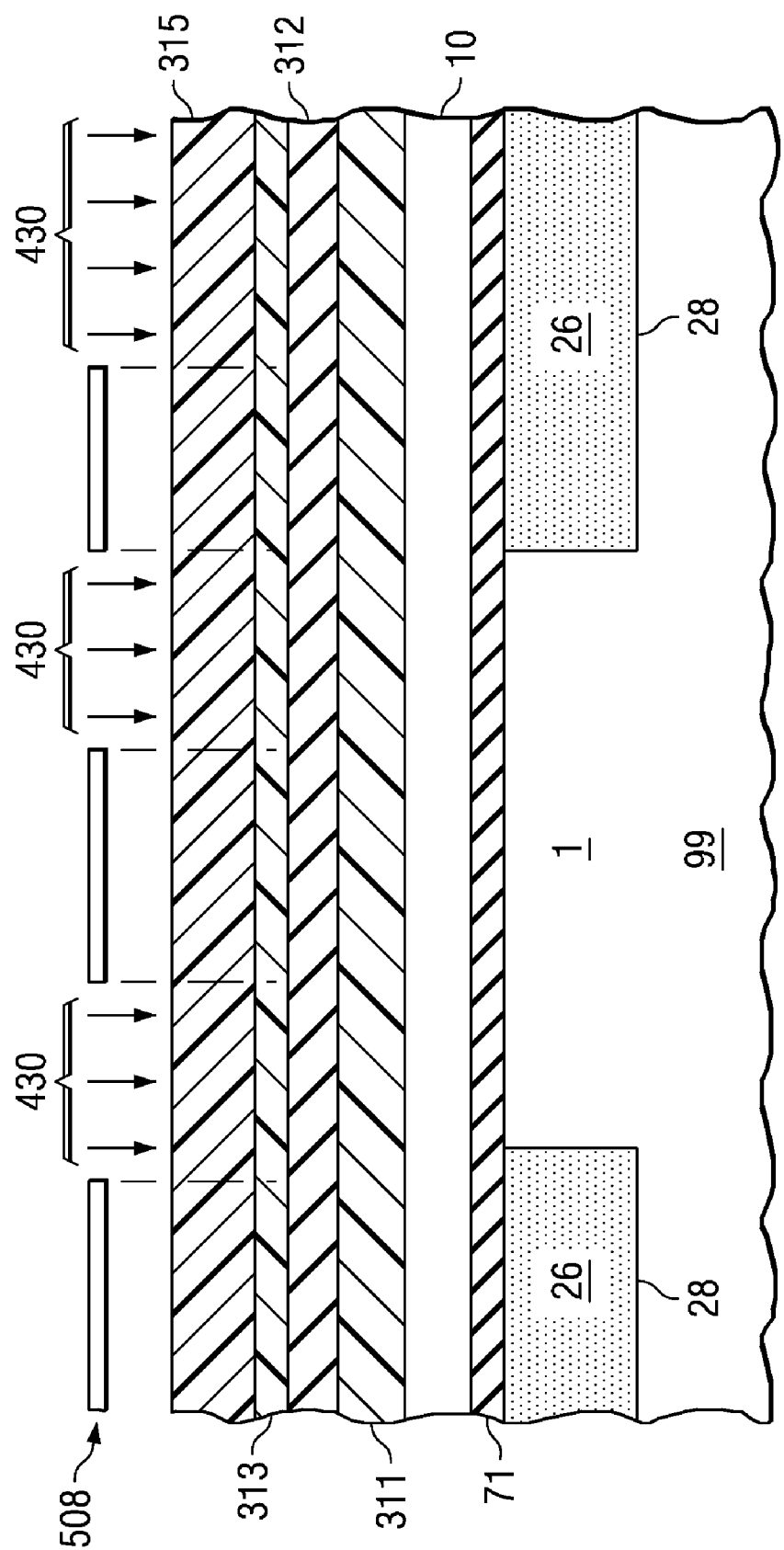
Figure 8C:
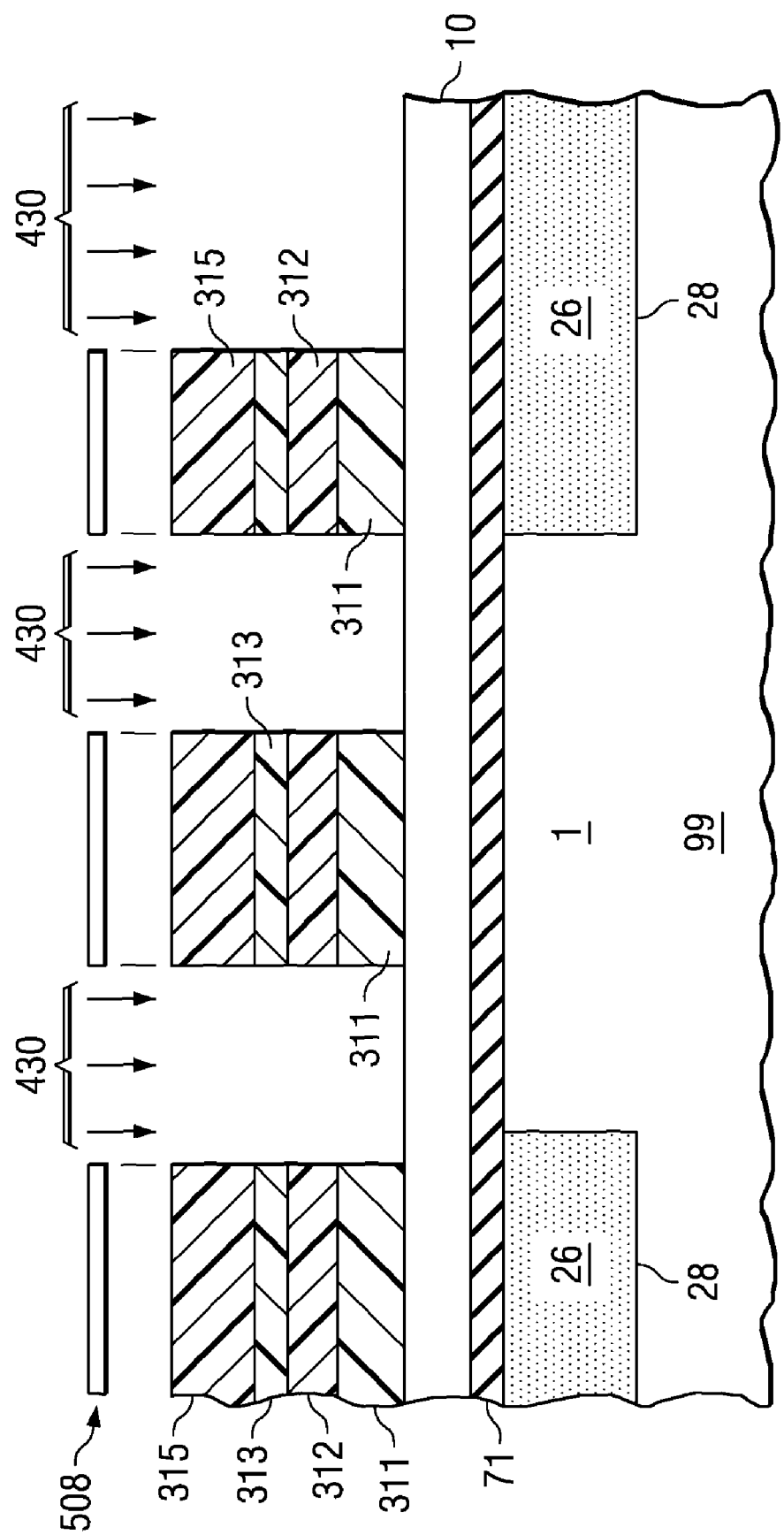
Figure 9:
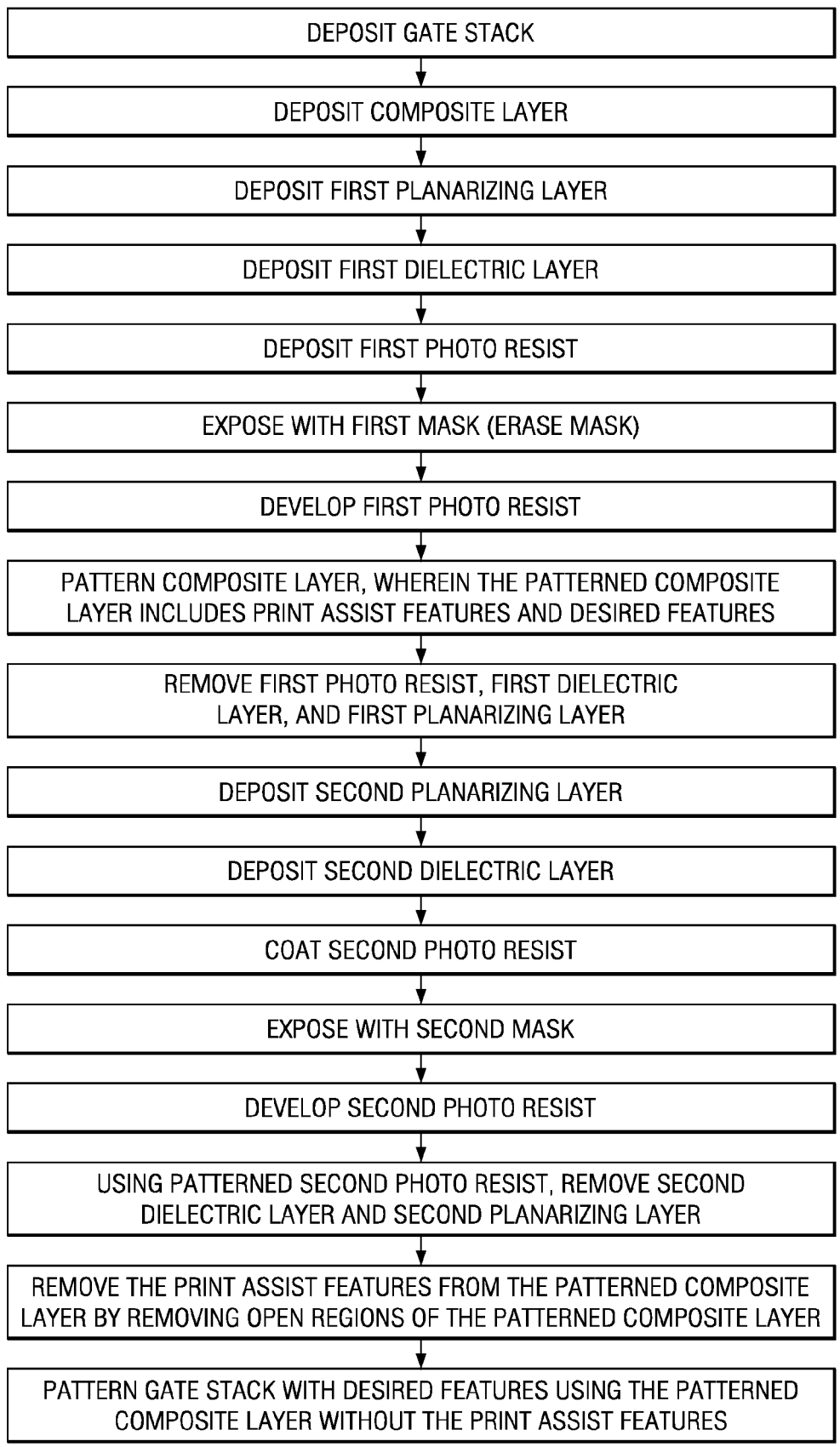
FIG. 9 illustrates a flow chart of the process steps of manufacturing an integrated circuit in accordance with an embodiment of the invention.

Another embodiment of a method of forming the integrated circuit using the double patterning technique is illustrated in FIG. 8 and the flow chart of FIG. 9. This embodiment is similar to the embodiment illustrated in FIG. 6, except the order of using the third mask level 498 and the fourth mask level 508 (of FIG. 5) is reversed. In particular, the fourth mask level 508 or erase mask is exposed before the third mask level 498.

FIG. 8a, hence illustrates an identical structure to that described in FIG. 6a. Referring next to FIG. 8b, the fourth mask level 508 is used to expose the first photo-resist layer 315 forming second exposed regions 430 and second unexposed regions 431. The second exposed regions 430 are developed as shown in FIG. 8c. Further, the regions of the first dielectric layer 313 and the first planarizing layer 312 thus opened are also removed, for example, using a wet etch. Finally, the open regions of the composite layer 311 are removed (FIG. 8d).

Referring to FIG. 8e, a photo-resist layer is deposited again and exposed. A second planarizing layer 317 is coated over the substrate 99 covering the exposed gate stack layer 10. A second dielectric layer 318 is deposited over the second planarizing layer 317. A second photo-resist layer 316 is deposited over the second dielectric layer 318. The second photo-resist layer 316 is exposed using the third mask level 498 of FIG. 5b, again forming first exposed regions 420 and first unexposed regions 421.

Referring to FIG. 8f, the composite layer 311 is patterned. The first exposed regions 420 are developed as shown in FIG. 8f. Further, the regions of the second dielectric layer 318 and the second planarizing layer 317 thus opened are also removed, for example, using a wet etch. Finally, the open regions of the composite layer 311 are removed.

The second photo-resist layer 316 (if remaining) is removed. The second dielectric layer 318 and the second planarizing layer 317 are removed forming a pattern on the composite layer 311 comprising only the desired features. Further processing continues as described, for example, in FIG. 3h.

In the embodiments described so far, an etch step was used to transfer the image before the second exposure step on the composite layer 311 (e.g., in FIG. 6c). In alternate embodiments, the two exposure steps (the first mask level 499 and the second mask level 509 of FIG. 2) may be performed concurrently without an intermediate etch step. In such embodiments, the final image is formed on the photo-resist by the combination of the first exposure and second exposure processes.

So far, various embodiments have illustrated the semiconductor device and methods for forming the device. Various embodiments exist in the implementation of the double patterning method in generating a layout and a mask. For example, an embodiment illustrated in FIG. 10 describes a final layout generated with designs optimally designed for each mask layer of the double patterning process.

Figure 10A:
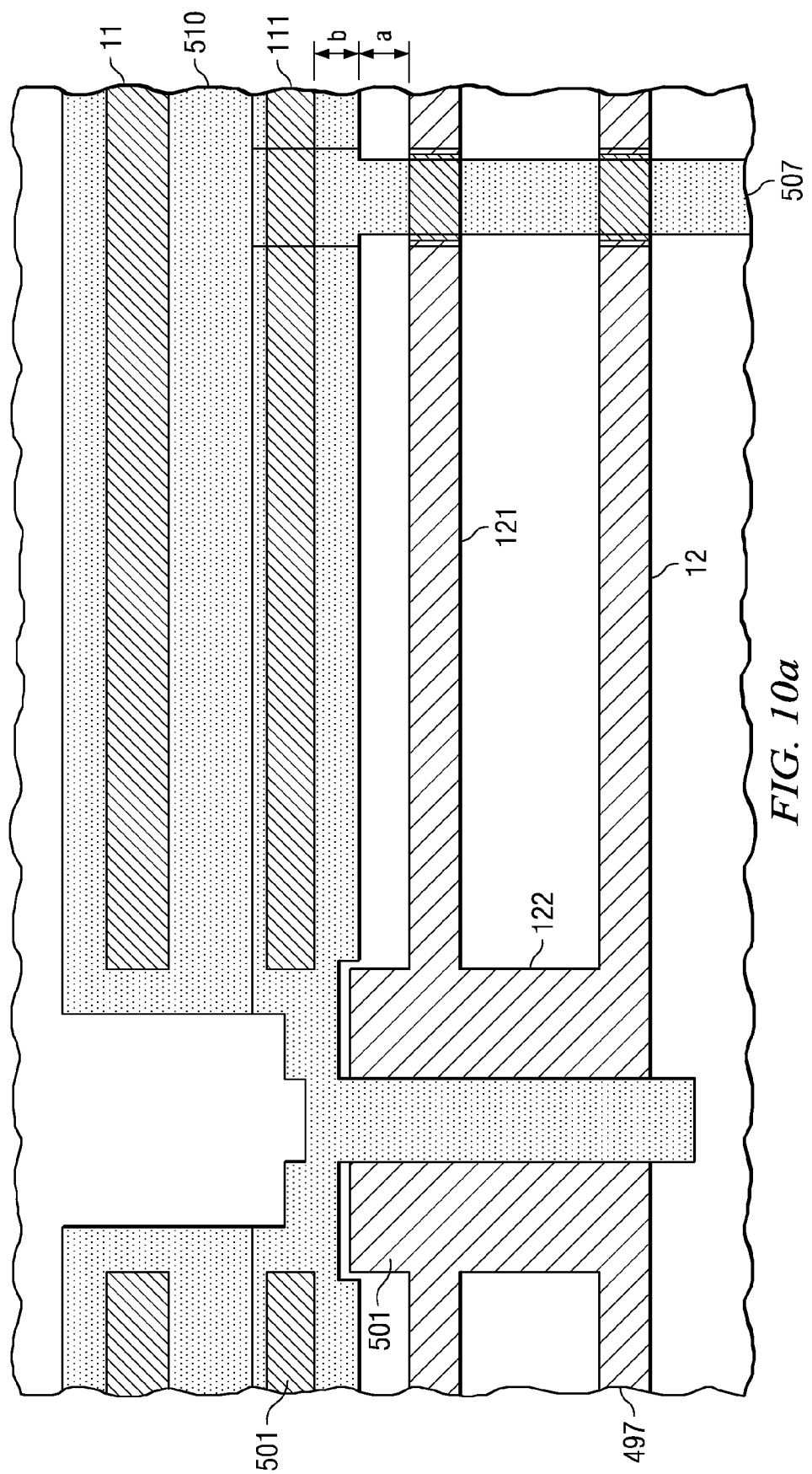
FIGS. 10a and 10b, illustrates a portion of a mask set for forming critical gate lines as well as printing assist features in accordance with embodiments of the invention.

An embodiment of the design methodology using the double patterning in layout design will now be described using FIG. 10. FIG. 10a illustrates an overlay of two masks used in the double patterning process. For example, opaque regions 501 on a fifth mask level 497 comprise desired features 12 including gate line 121 and uncritical features 122, as well as printing assist features 11. The printing assist features 11 are additional features and may comprise physical extensions of the desired features 12. An erase mask or a sixth mask level 507 removes the printing assist features 11. The gate line 121 is typically surrounded by contacts in the source and drain regions. The sixth mask level 507 needs to be aligned in such a manner that the printing assist features 11 are removed without removing the gate lines 121. Hence, a distance "a" from the last gate line 121 to the edge of transparent regions 510 on the sixth mask level 507 is maximized without minimizing a distance "b" from the edge of the transparent regions 510 on the sixth mask level 507 to the last printing assist feature 111. Such an optimization is necessary for producing sufficient space for placement of contacts.

Figure 10B:
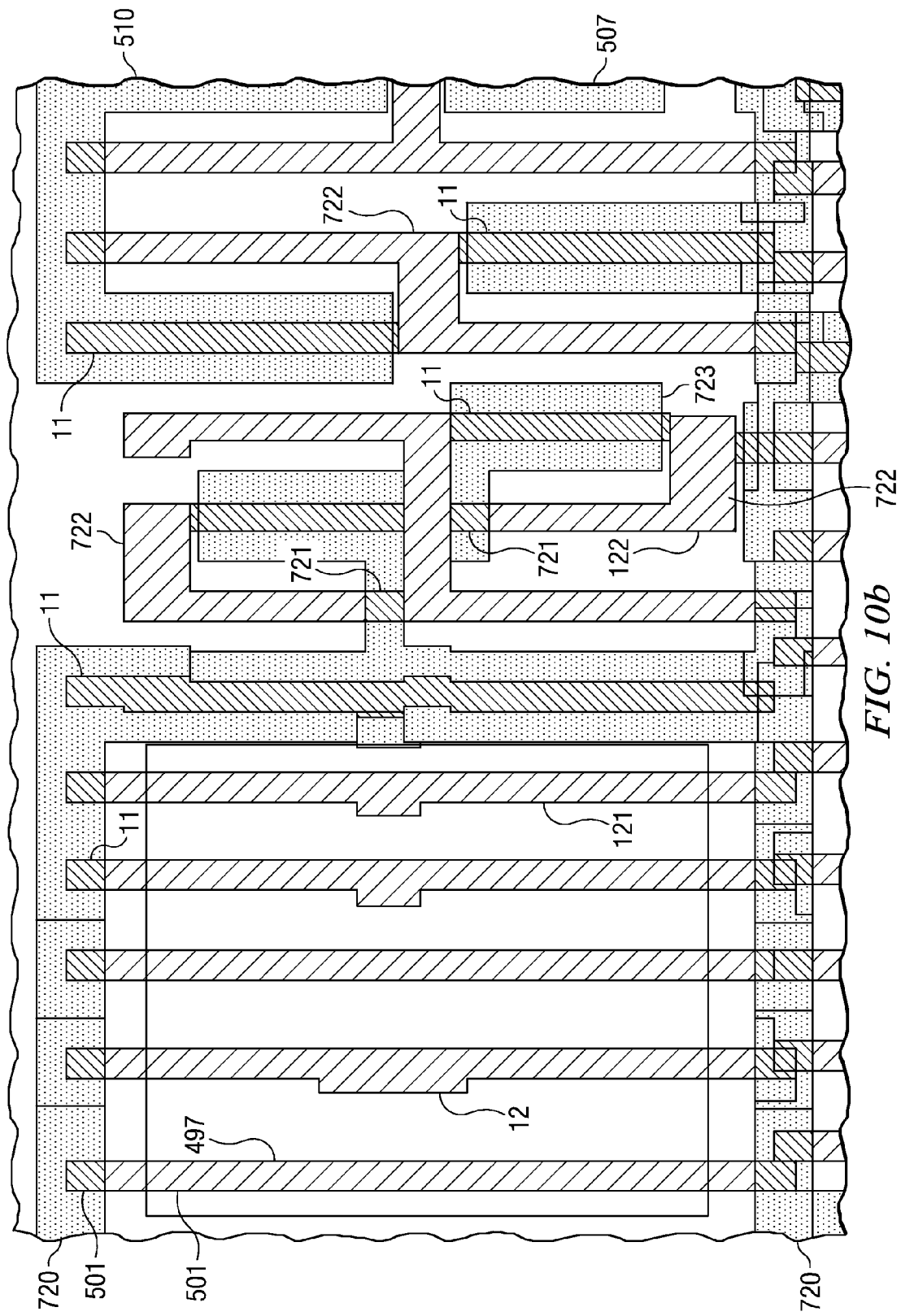

Similarly, FIG. 10b illustrates opaque regions 501 on the fifth mask level 497 and transparent regions 510 on the sixth mask level 507 (erase mask). Also illustrated are the desired features 12 including gate line 121 and uncritical features 122, as well as printing assist features 11. Unlike oval or circular line ends formed in a single exposure process, various embodiments using the double patterning process form square line ends 721. Hence, adjacent line ends can be brought closer. Thus advantageously saving silicon real estate, a key component while shrinking devices to the next technology node. In a single exposure process, gate lines near the line ends 721 tend to shrink or neck and form regions over the active silicon without a gate line or with a smaller gate length, thus shorting the device. Typically, longer lines are used to avoid the deleterious effects of necking.

The use of the erase mask as described in various embodiments of the invention avoids necking, as extended gate lines 720 are patterned with the exposed mask, which are later removed by the erase mask. The corner rounding 722 of the gate lines is significantly reduced, improving the margin for contacts landing on the gate lines. Finally, necking at line ends stays safely outside active area.

In various embodiments described (for example, FIG. 10a or 10b), the erase mask comprises cut features, which are features of different sizes and shapes. For example, the cut features comprise a two dimensional shape, wherein at least one of the sides of the two dimensional shape is smaller in length than a parallel opposite side. Specific examples as illustrated in FIG. 10b include a "T" or "L" shaped cut feature.

Referring to FIG. 10b, the shape, size and placement of these cut features are optimized with respect to critical line width features (e.g., gate line 121), the placement of the printing assist features (e.g., printing assist features 11), and adjacent uncritical linewidth features (e.g., uncritical features 122). In various embodiments, the cut features comprise features formed over extended desired features 12 for reducing line end shortening (e.g., extended gate lines 720 or line ends 721). The cut features also comprise T-type structures 723 for removing printing assist features 11 that connect to uncritical features 122, and significantly reduce corner rounding 722.

Figure 11A:
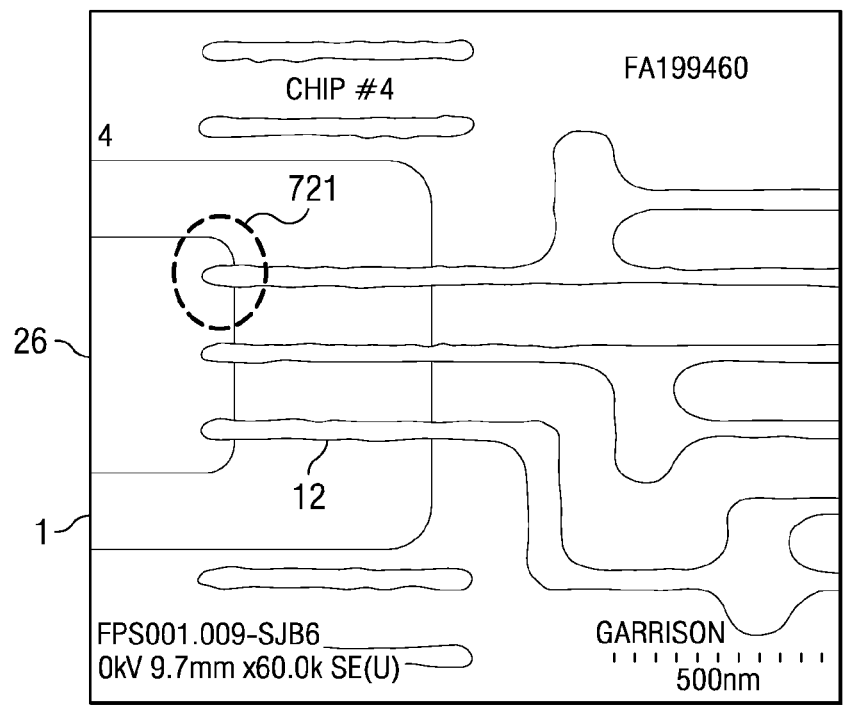
Figure 11B:
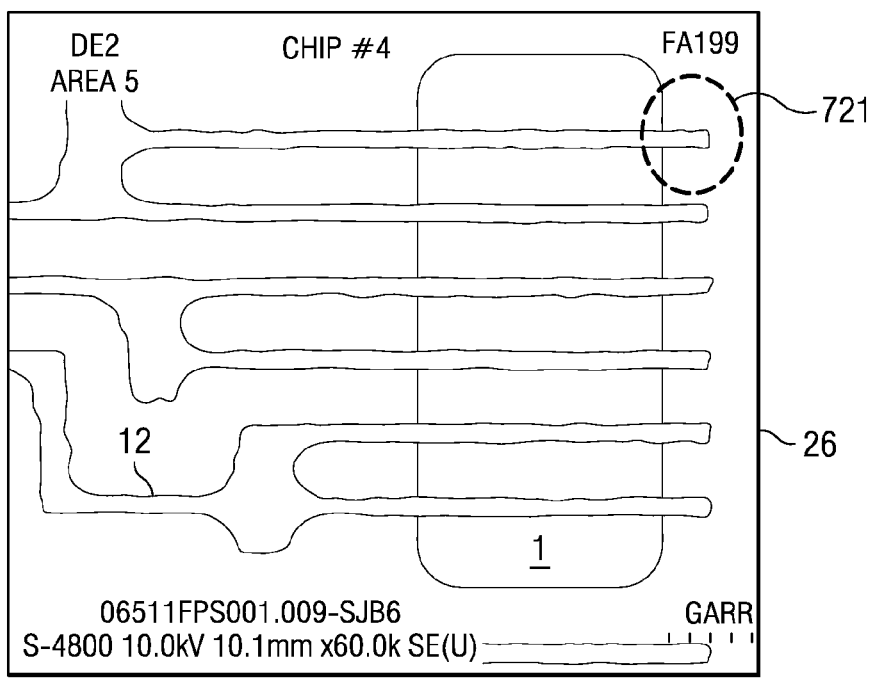
Figure 11C:
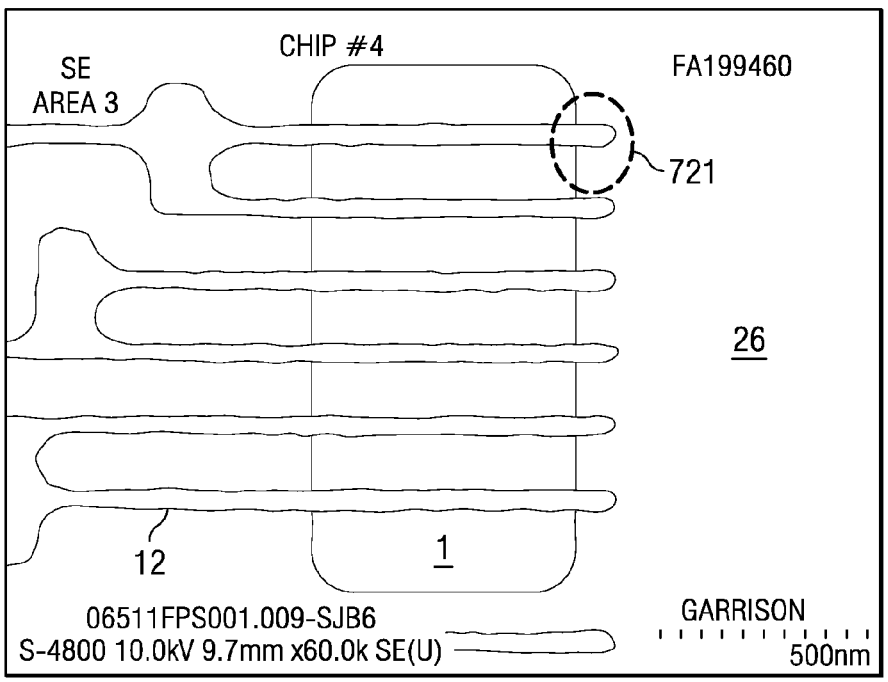
Figure 11D:
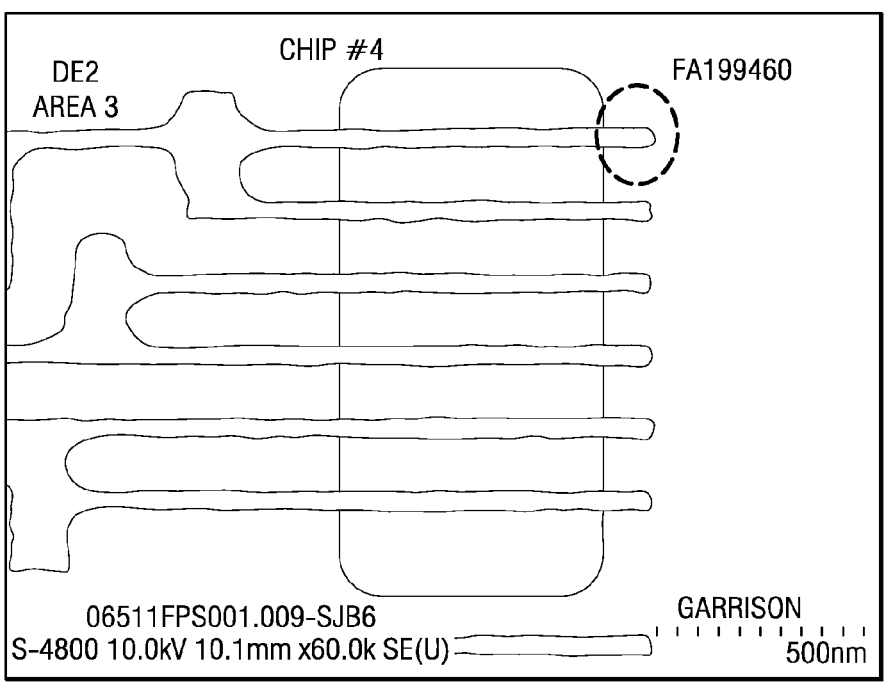
Figure 11E:
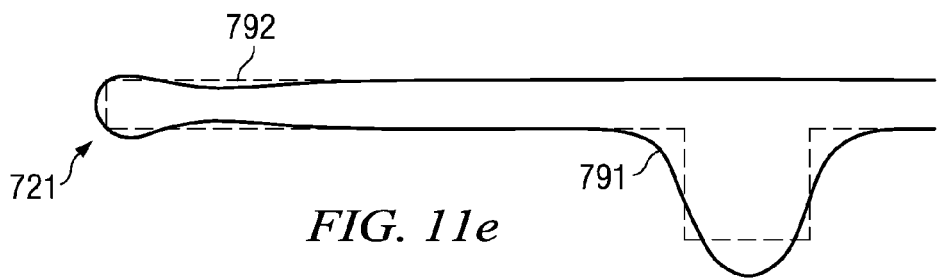

FIG. 11 illustrates a top view of gate lines fabricated over a substrate, wherein FIGS. 11a and 11c illustrate gate lines formed in a single exposure and FIGS. 11b and 11d illustrate gate lines formed in accordance with embodiments of the invention. FIG. 11e illustrates a magnified schematic of some of these distinctions for a single line formed in accordance with embodiments of the invention.

As described with respect to the layout of FIG. 10, FIG. 11 illustrates some of the key differences between a single exposure process and a double patterning process in accordance with embodiments of the invention. The line ends of FIGS. 11b and 11d show no corner rounding or necking whereas the line ends of FIGS. 11a and 11c illustrate both. In particular, the line ends of tips of FIGS. 11b and 11d illustrate sharp corners and tips. FIG. 11e illustrate the rounded corners and line ends of first lines 791 processed with single exposure compared with sharp corners and tips for second lines 792 processed using embodiments of the present invention.

FIG. 12, which includes FIG. 12a-12e, illustrates an embodiment of the invention using multiple mask levels for either forming the desired features and the print assist features, or multiple mask levels for forming the cut shapes.

Figure 12A:
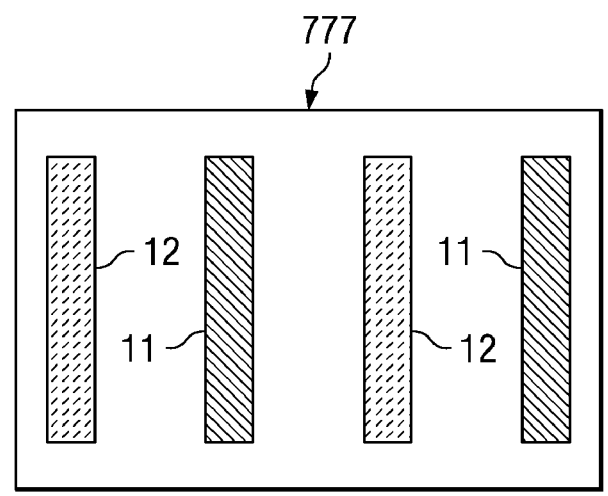
FIGS. 12a-12e, illustrates an embodiment of the invention using multiple mask levels for either forming the desired features and the print assist features, or multiple mask levels for forming the cut shapes.
Figure 12B:
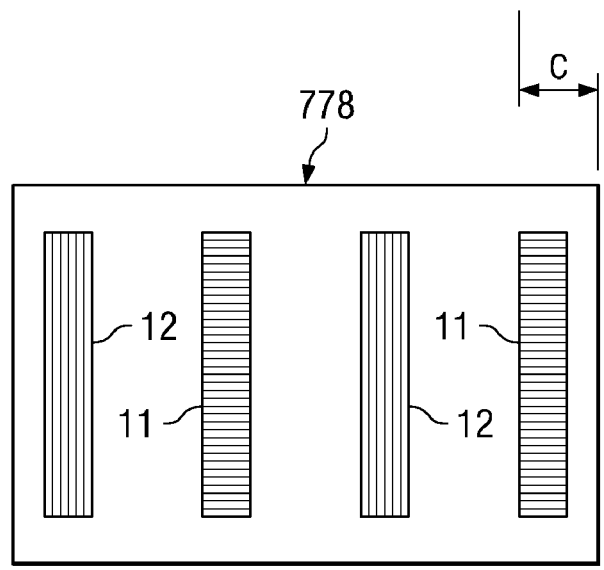

Referring to FIG. 12a, the first reticle 777 comprising features for forming desired features 12 as well as for forming printing assist features 11. As described before, the printing assist features 11 are the additional features. However, unlike the prior embodiments, a second reticle 778 is used sequentially along with the first reticle 777. In various embodiments, the second reticle 778 may contain identical features to the first reticle 777; however, the features on the second reticle 778 are laterally displaced relative to the features on the first reticle 777. For example, in FIG. 12b, the desired features 12 on the second reticle 778 are laterally displaced by a distance "c" relative to the desired features 12 on the first reticle 777. For example, as illustrated in FIG. 12, a two reticle set is used for pitch doubling by splitting the pitch into two masks, so that each mask patterns a larger minimum feature than the final patterned structure.

Figure 12C:
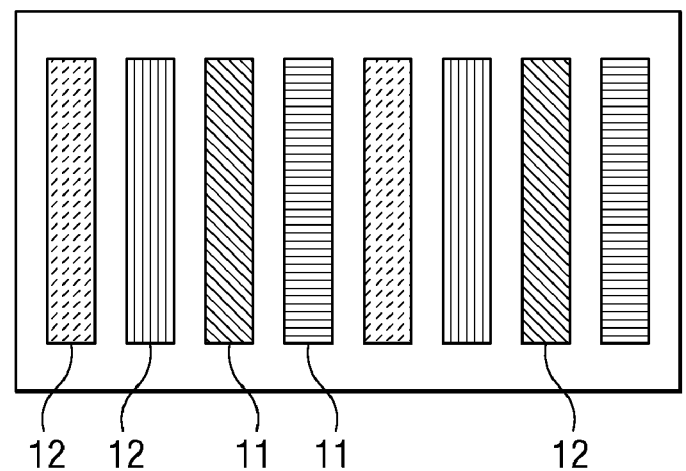

The wafer is processed, for example, as described in previous embodiments with respect to FIG. 6a-6d. However, unlike FIGS. 6a-6d, a second reticle 778 is used and the patterning process repeated. Referring to FIG. 12c, after the patterning of the composite layer with the first and second reticles 777 and 778, the wafer comprises the desired features 12 and the printing assist features 11 as illustrated in FIG. 12c. Although illustrated using two reticles, this process can be extended to more number of reticles in various embodiments.

Figure 12D:
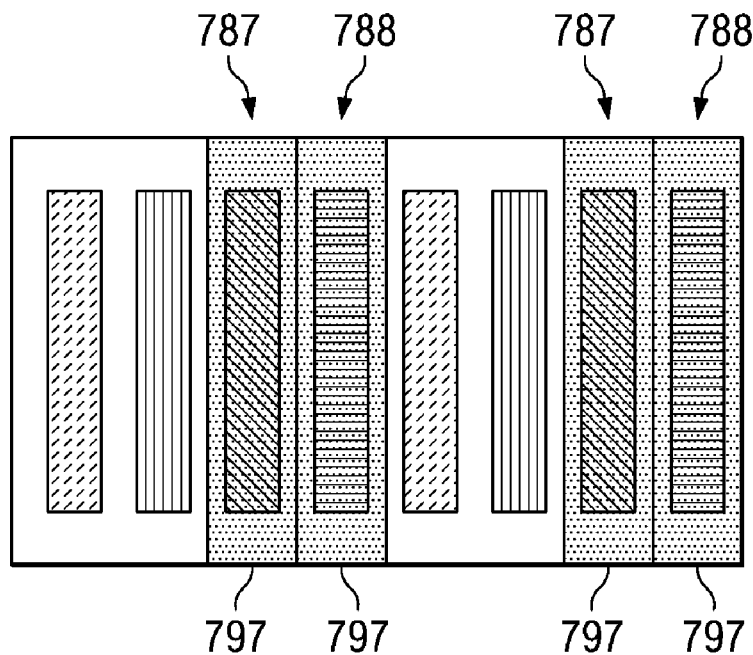
Figure 12E:
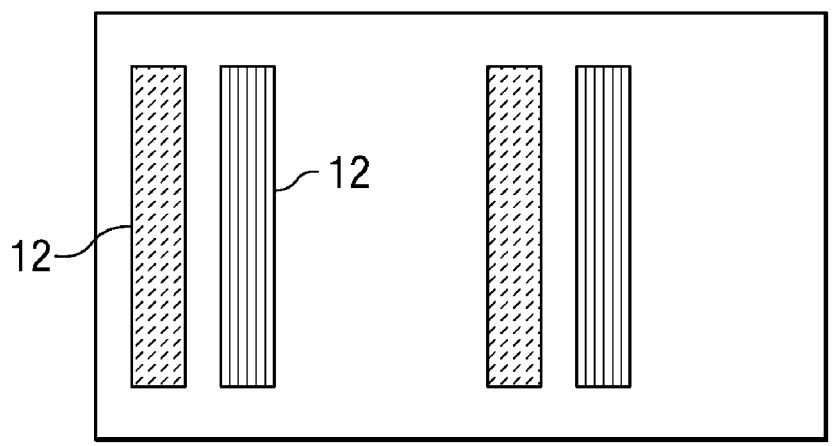

Next, referring to FIG. 12d, a third reticle 787 comprising the cut features 797 is used to remove a portion of the printing assist features 11. Similarly, a fourth reticle 788 comprising the cut features 797 removes another portion of the printing assist features 11. Each of the third reticles 787 and 787 follows the process described in earlier embodiments (for example FIGS. 6e-6h). As illustrated in FIG. 12e, a final pattern of the composite layer 311 comprising only the desired features 12 is formed.

Although embodiments of the present invention and their advantages have been described in detail, it should be understood that various changes, substitutions and alterations can be made herein without departing from the spirit and scope of the invention as defined by the appended claims. For example, it will be readily understood by those skilled in the art that many of the features, functions, processes, and materials described herein may be varied while remaining within the scope of the present invention. Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. A method of manufacturing a structural building block of a semiconductor device, the method comprising:
depositing a first material layer over a semiconductor substrate, the first material layer covering a first and a second region;
depositing a first composite layer over the first material layer;
forming a first template in the first composite layer using a first and a second lithographic mask, the template comprising first features and second features, wherein the first features comprise a pattern for components of the semiconductor device and the second features comprise a pattern for printing assist features, wherein the forming a first template in the first composite layer comprises:
patterning a first intermediate layer disposed over the first composite layer using the first lithographic mask,
patterning the first composite layer using the patterned first intermediate layer into the first material layer,
after patterning the first composite layer using the patterned first intermediate layer, forming a second intermediate layer over the first composite layer,
patterning the second intermediate layer using the second lithographic mask, and
forming the first template by patterning the first composite layer using the patterned second intermediate layer; and
forming a second template in the first composite layer by removing the second features using a third lithographic mask or a third lithographic mask and a fourth lithographic mask.

2. The method of claim 1, wherein the first material layer comprises a conductive material.

3. The method of claim 1, wherein the first material layer comprises an insulating material.

4. A method of manufacturing a structural building block of a semiconductor device, the method comprising:
depositing a first material layer over a semiconductor substrate, the first material layer covering a first and a second region;
depositing a first composite layer over the first material layer;
forming a first template in the first composite layer using a first and a second lithographic mask, the template comprising first features and second features, wherein the first features comprise a pattern for components of the semiconductor device and the second features comprise a pattern for printing assist features; and
forming a second template in the first composite layer by removing the second features using a third lithographic mask or a third lithographic mask and a fourth lithographic mask, wherein forming a second template in the first composite layer comprises:
  depositing a third intermediate layer over the first template,
  patterning the third intermediate layer using the third lithographic mask,
  patterning the first composite layer using the patterned third intermediate layer,
  after patterning the first composite layer using the patterned third intermediate layer, depositing a fourth intermediate layer over the first composite layer;
  patterning the fourth intermediate layer using the fourth lithographic mask, and
  forming the second template by patterning the first composite layer using the patterned fourth intermediate layer.

5. A method of manufacturing a structural building block of a semiconductor device, the method comprising:
  forming isolation regions adjacent to active regions on a semiconductor substrate;
  depositing a first material layer over the semiconductor substrate;
  depositing a first composite layer over the first material layer;
  using a first lithographic mask to pattern the first composite layer, thereby forming first features on the first composite layer, wherein using the first lithographic mask to pattern the first composite layer comprises:
    depositing a first planarizing layer over the first composite layer,
    depositing a first intermediate layer over the first planarizing layer,
    patterning the first intermediate layer and the first planarizing layer using the first mask, and
    patterning the first composite layer using the patterned first intermediate layer;
  depositing a photo-resist layer over the first composite layer;
  using a second lithographic mask to pattern the photo-resist layer, the patterned photo-resist layers comprising photo-resist features; and
  using the patterned photo-resist layer as a mask to remove some, but not all, of the first features from the first composite layer.

6. The method of claim 5, wherein using the patterned photo-resist layer as a mask to remove some, but not all, of the first features from the first composite layer comprises removing the first composite layer not underneath the photo-resist features.

7. The method of claim 5, wherein the second lithographic mask is configured to remove first features that are not part of a target pattern.

8. The method of claim 5, wherein at least some of the photo-resist features are oriented perpendicular to at least some of the first features.

9. The method of claim 5, wherein at least some of the photo-resist features comprise a two dimensional shape, wherein at least one of the sides of the two dimensional shape is smaller in length than a parallel opposite side.

10. The method of claim 9, wherein using the photo-resist features comprise a "T" or "L".

11. The method of claim 5, wherein the first material layer comprises a conductive material.

12. The method of claim 5, wherein the first material layer comprises an insulating material.

13. A method of manufacturing a structural building block of a semiconductor device, the method comprising:
  depositing a first material layer over a semiconductor substrate;
  depositing a first composite layer over the first material layer;
  using at least one first mask to pattern the first composite layer thereby forming first and second features, wherein the first features comprise patterns for the semiconductor device and the second features comprise printing assist features, wherein using the at least one first mask to pattern the first composite layer comprises:
    depositing a first planarizing layer over the first composite layer,
    depositing a first intermediate layer over the first planarizing layer,
    patterning the first intermediate layer and the first planarizing layer using the first mask, and
    patterning the first composite layer using the patterned first intermediate layer; and
  using at least one second mask to remove the second features from the first composite layer.

14. The method of claim 13, wherein the second features are disposed above an isolation region adjacent an active region and/or disposed above the active region.

15. The method of claim 13, further comprising:
  patterning the first material layer using the first features of the composite layer as a mask, the first material layer comprising a conductive material.

16. The method of claim 13, wherein using the at least one first mask to pattern the first composite layer also patterns at least a top portion of the first material layer.

17. The method of claim 13, further comprising:
  patterning the first material layer using the first features of the composite layer as a mask, the first material layer comprising an insulating material.

18. The method of claim 13, wherein the first and second features remain on the semiconductor substrate after patterning the first composite layer.

19. The method of claim 13, wherein the first features are patterns for additive features.

20. The method of claim 19, wherein the additive features comprise patterns for forming lines.

21. A method of manufacturing a structural building block of a semiconductor device, the method comprising:
  depositing a first material layer over a semiconductor substrate;
  depositing a first composite layer over the first material layer;
  using at least one first mask to pattern the first composite layer thereby forming first and second features, wherein the first features comprise patterns for the semiconductor device and the second features comprise printing assist features; and
  using at least one second mask to remove the second features from the first composite layer, wherein using at least one second mask to remove the second features comprises:
    depositing a first planarizing layer over the patterned first composite layer,
    depositing a first intermediate layer over the first planarizing layer,
    forming a resist template by patterning the first intermediate layer and the first planarizing layer using the second mask, and
    patterning the first composite layer using the patterned second first intermediate layer.

22. The method of claim 21, wherein the resist template is wider than the second features.

23. A method of manufacturing a structural building block of a semiconductor device, the method comprising:
- depositing a first material layer over a semiconductor substrate, the first material layer covering a first and a second region;
- depositing a first composite layer over the first material layer;
- forming a first template in the first composite layer using a first and a second mask, the template comprising first features and second features, wherein the first features comprise a pattern for components of the semiconductor device and the second features comprise a pattern for printing assist features wherein the forming a first template in the first composite layer comprises:
  - depositing a first planarizing layer over the first composite layer,
  - depositing a first intermediate layer over the first planarizing layer,
  - patterning the first intermediate layer and the first planarizing layer using the first mask,
  - patterning the first composite layer using the patterned first intermediate layer into the first material layer,
  - after patterning the first composite layer using the patterned first intermediate layer, depositing a second planarizing layer over the first composite layer,
  - depositing a second intermediate layer over the second planarizing layer,
  - patterning the second intermediate layer and the second planarizing layer using the second mask, and
  - forming the first template by patterning the first composite layer using the patterned second intermediate layer; and
- forming a second template in the first composite layer by removing the second features using a third mask or a third mask and a fourth mask.

24. The method of claim 23, wherein the first material layer comprises a conductive material.

25. The method of claim 23, wherein the first material layer comprises an insulating material.

26. A method of manufacturing a structural building block of a semiconductor device, the method comprising:
- depositing a first material layer over a semiconductor substrate, the first material layer covering a first and a second region;
- depositing a first composite layer over the first material layer;
- forming a first template in the first composite layer using a first and a second mask, the template comprising first features and second features, wherein the first features comprise a pattern for components of the semiconductor device and the second features comprise a pattern for printing assist features; and
- forming a second template in the first composite layer by removing the second features using a third mask or a third mask and a fourth mask, wherein forming a second template in the first composite layer comprises:
  - depositing a first planarizing layer over the first template,
  - depositing a first intermediate layer over the first planarizing layer,
  - patterning the first intermediate layer and the first planarizing layer using the third mask,
  - patterning the first composite layer using the patterned first intermediate layer,
  - after patterning the first composite layer using the patterned first intermediate layer, depositing a second planarizing layer over the first composite layer,
  - depositing a second intermediate layer over the second planarizing layer,
  - patterning the second intermediate layer and the second planarizing layer using the fourth mask, and
  - forming the second template by patterning the first composite layer using the patterned second intermediate layer.

* * * * *

UNITED STATES PATENT AND TRADEMARK OFFICE
CERTIFICATE OF CORRECTION

PATENT NO. : 8,039,203 B2  
APPLICATION NO. : 12/126741  
DATED : October 18, 2011  
INVENTOR(S) : Wang et al.

Page 1 of 1

It is certified that error appears in the above-identified patent and that said Letters Patent is hereby corrected as shown below:

In Col. 16, line 65, claim 21, delete "second".

Signed and Sealed this
Third Day of January, 2012

David J. Kappos
*Director of the United States Patent and Trademark Office*